(12) United States Patent
Satou

(10) Patent No.: US 9,723,917 B2
(45) Date of Patent: Aug. 8, 2017

(54) TABLE DEVICE AND CONVEYANCE DEVICE

(71) Applicant: NSK LTD., Tokyo (JP)

(72) Inventor: Toshinori Satou, Kanagawa (JP)

(73) Assignee: NSK LTD., Shinagawa-ku, Tokyo (JP)

( * ) Notice: Subject to any disclaimer, the term of this patent is extended or adjusted under 35 U.S.C. 154(b) by 0 days.

(21) Appl. No.: 14/901,378

(22) PCT Filed: Dec. 18, 2013

(86) PCT No.: PCT/JP2013/083968
§ 371 (c)(1),
(2) Date: Dec. 28, 2015

(87) PCT Pub. No.: WO2015/001688
PCT Pub. Date: Jan. 8, 2015

(65) Prior Publication Data
US 2016/0135588 A1 May 19, 2016

(30) Foreign Application Priority Data

Jul. 2, 2013 (JP) ................................. 2013-138731

(51) Int. Cl.
*A47B 11/00* (2006.01)
*A47B 13/08* (2006.01)
(Continued)

(52) U.S. Cl.
CPC .......... *A47B 13/081* (2013.01); *F16C 29/008* (2013.01); *F16C 29/025* (2013.01);
(Continued)

(58) Field of Classification Search
CPC .... A47B 13/081; F16C 29/008; F16C 29/025; F16C 29/06; F16C 29/004;
(Continued)

(56) References Cited

U.S. PATENT DOCUMENTS 5,228,358 A * 7/1993 Sakino ...................... B23Q 1/38
  108/143
5,760,500 A * 6/1998 Kondo ................... H02K 41/02
  248/913
(Continued)

FOREIGN PATENT DOCUMENTS

CN 201954205 U 8/2011
JP 3-245932 A 11/1991
(Continued)

OTHER PUBLICATIONS

Japanese Notice of Rejection for JP 2013-138731 dated Jan. 14, 2014.
(Continued)

*Primary Examiner* — Hanh V Tran
(74) *Attorney, Agent, or Firm* — Sughrue Mion, PLLC

(57) ABSTRACT

A table device including: a first base including a first reference surface; a second base including a second reference surface, and movable on the first reference surface in a direction parallel to a first axis; a first bearing member provided to the second base, and forming a gas bearing between the first bearing member and the first reference surface; a second bearing member provided to the second base, apart from the first bearing member relative to a direction parallel to a second axis perpendicular to the first axis, and forming a gas bearing between the second bearing member and the first reference surface; and a table movable on the second reference surface. A distance between the first bearing member and the second bearing member is longer than a dimension of a moving range of the table relative to the direction parallel to the second axis.

9 Claims, 8 Drawing Sheets

(51) Int. Cl.
*G03F 7/20* (2006.01)
*F16C 29/02* (2006.01)
*F16C 29/06* (2006.01)
*F16C 32/06* (2006.01)
*F16C 29/00* (2006.01)

(52) U.S. Cl.
CPC .......... *F16C 29/06* (2013.01); *F16C 32/0614* (2013.01); *G03F 7/70716* (2013.01); *G03F 7/70816* (2013.01); *F16C 29/004* (2013.01); *F16C 32/0618* (2013.01)

(58) Field of Classification Search
CPC .............. F16C 32/0614; F16C 32/0618; G03F 7/70716; G03F 7/70816
See application file for complete search history.

(56) References Cited

U.S. PATENT DOCUMENTS

| | | | | |
|---|---|---|---|---|
| 5,858,587 | A * | 1/1999 | Yamane | F16C 32/0618 355/53 |
| 7,030,964 | B2 * | 4/2006 | Akutsu | G03F 7/70716 250/492.22 |
| 7,154,588 | B2 * | 12/2006 | Emoto | F16C 29/025 355/72 |
| 2002/0070699 | A1 * | 6/2002 | Tanaka | G03F 7/70716 318/687 |
| 2002/0180159 | A1 * | 12/2002 | Nakamura | F16C 29/025 277/500 |
| 2006/0033391 | A1 * | 2/2006 | Takashima | B23Q 1/621 310/90.5 |
| 2006/0124864 | A1 * | 6/2006 | Sogard | F16C 29/025 250/491.1 |
| 2007/0154120 | A1 * | 7/2007 | Kawai | F16C 29/025 384/12 |
| 2008/0151213 | A1 * | 6/2008 | Arai | F16C 29/025 355/72 |
| 2008/0304772 | A1 * | 12/2008 | Kakutani | F16C 29/025 384/12 |
| 2009/0059190 | A1 * | 3/2009 | Tanaka | F16C 29/025 355/30 |
| 2011/0204255 | A1 * | 8/2011 | Ooae | F16C 29/025 250/453.11 |
| 2012/0056105 | A1 * | 3/2012 | Aoki | F16C 29/025 250/491.1 |
| 2012/0057140 | A1 * | 3/2012 | Aoki | G03F 7/70716 355/53 |

FOREIGN PATENT DOCUMENTS

| | | |
|---|---|---|
| JP | 11166990 A | 6/1999 |
| JP | 11294456 A | 10/1999 |
| JP | 2000-136824 A | 5/2000 |
| JP | 2000346070 A | 12/2000 |
| JP | 3832084 B2 | 10/2006 |

OTHER PUBLICATIONS

International Search Report for PCT/JP2013/083968 dated Jan. 28, 2014.

Communication dated Mar. 29, 2016 from the State Intellectual Property Office of P.R. China in counterpart application No. 201380003549.X.

* cited by examiner

FIG.3
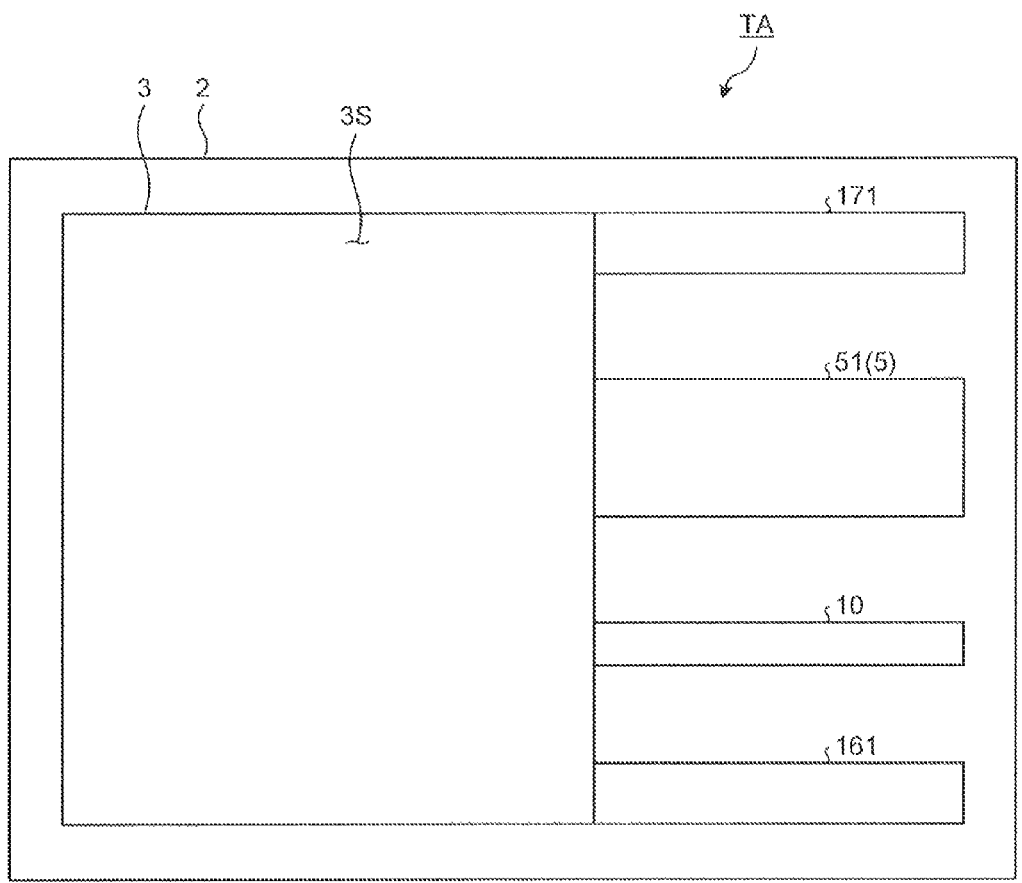
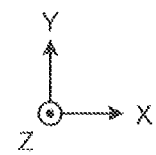

TABLE DEVICE AND CONVEYANCE DEVICE

This application is a National Stage of PCT international application Ser. No. PCT/JP2013/083968 filed on Dec. 18, 2013 which designates the United States, incorporated herein by reference, and which is based upon and claims the benefit of priority from Japanese Patent Application No. 2013-138731 filed on Jul. 2, 2013, the entire contents of which are incorporated herein by reference.

FIELD

The present invention relates to a table device and a conveyance device.

BACKGROUND

In conveyance devices, table devices provided with a movable table, like ones disclosed in Patent Literatures 1 and 2, are used.

CITATION LIST

Patent Literature

Patent Literature 1: Japanese Patent No. 3832084
Patent Literature 2: Japanese Laid-open Patent Publication No. 2000-136824

SUMMARY

Technical Problem

When positioning accuracy of a table is decreased and the table is not arranged in a desired position in a table device, performance of a conveyance device provided with the table device may be decreased. For example, when the table is pitched although the table is intended to be moved straight on a horizontal plane, or when an upper surface of the table is inclined with respect to the horizontal plane although the upper surface of the table is intended to become parallel to the horizontal plane, the positioning accuracy of the table may be decreased. As a result, an object placed on the table may not be arranged in a desired position.

An objective of the present invention is to provide a table device and a conveyance device that can suppress a decrease in positioning accuracy

Solution to Problem

A table device according to an aspect of the present invention for achieving the above objective includes: a first base including a first reference surface parallel to a predetermined surface; a second base including a second reference surface parallel to the predetermined surface, and movable on the first reference surface in a direction parallel to a first axis existing in the predetermined surface; a first bearing member that is provided to the second base, includes a first gas supply port facing the first reference surface, and forms a gas bearing between the first bearing member and the first reference surface with a gas supplied through the first gas supply port; a second bearing member that is provided to the second base, apart from the first bearing member relative to a direction parallel to a second axis perpendicular to the first axis and existing in the predetermined surface, includes a second gas supply port facing the first reference surface, and forms a gas bearing between the second bearing member and the first reference surface with a gas supplied through the second gas supply port; and a table movable on the second reference surface in the direction parallel to the second axis. A distance between the first bearing member and the second bearing member is longer than a. dimension of a moving range of the table relative to the direction parallel to the second axis.

Therefore, the second base is moved on the first reference surface of the first base in a direction parallel to the first axis, and the table is moved on the second reference surface of the second base in a direction parallel to the second axis. Therefore, the table can be moved in both of the direction parallel to the first axis and the direction parallel to the second axis. The first bearing member and the second bearing member each form the corresponding gas bearing that generates force (floating force) in a vertical direction to the predetermined surface. That is, each of the first bearing member and the second bearing member forms a so-called vertical-direction gas bearing (up-and-down-direction gas bearing). When the table is moved on the second reference surface in the direction parallel to the second axis, the distance between the first bearing member (first vertical-direction gas bearing) and the second bearing member (second vertical-direction gas bearing) is longer than the dimension of the moving range (stroke) of the table relative to the moving direction of the table (the direction parallel to the second axis). Therefore, even if the table is moved in the moving range, a load of the table is supported by the gas bearing formed by the first bearing member and the gas bearing formed by the second bearing member. Accordingly, pitching of the table and inclination of the upper surface of the table are suppressed in the moving range of the table. Therefore, a decrease in positioning accuracy of the table is suppressed.

In the table device according to an aspect of the present invention, the moving range of the table is determined such that a center of gravity of the table is moved between the first bearing member and the second bearing member relative to the direction parallel to the second axis.

Therefore, the center of gravity of the table is not moved outside from between the first bearing member (first vertical-direction gas bearing) and the second bearing member (second vertical-direction gas bearing). Therefore, even if the table is moved in the moving range, a load of the table is supported by the gas bearing formed by the first bearing member and the gas bearing formed by the second bearing member. Accordingly, the pitching of the table and the inclination of the upper surface of the table are suppressed.

The table device according to an aspect of the present invention includes a first guide member that is provided to the first base, and guides the second base to the direction parallel to the first axis.

Therefore, the second base is guided by the first guide member, and is moved in the target trajectory relative to the direction parallel to the first axis. Accordingly, the table supported by the second base is also moved in the target trajectory relative to the direction parallel to the first axis.

The table device according to an aspect of the present invention includes a third bearing member that is provided to the second base, includes a third gas supply port facing a first side surface of the first guide member, the first side surface facing a first direction parallel to the second axis, and forms a gas bearing between the third bearing member and the first side surface with a gas supplied through the third gas supply port. The first bearing member includes a fourth gas supply port arranged to face a second side surface of the first guide member, the second side surface facing an opposite direction to the first direction, and forms a gas bearing between the first bearing member and the second side surface with a gas supplied through the fourth gas supply port.

Therefore, the first bearing member and the third bearing member are supported by the first guide member in a non-contact manner, and the first bearing member and the third bearing member can be moved in the direction parallel to the first axis. The first bearing member and the third bearing member each form the corresponding gas bearing that generates force in the direction parallel to the second axis. That is, each of the first bearing member and the third bearing member forms a so-called horizontal-direction gas bearing. Accordingly, the first bearing member and the third bearing member are moved in the target trajectory relative to the direction parallel to the first axis while displacement of the first bearing member and the third bearing member in the direction parallel to the second axis is suppressed. Further, since the distance between the gas bearing formed by the first bearing member and the gas bearing formed by the third bearing member is short relative to the direction parallel to the second axis, an increase in the amount of change of a dimension of a gap between the first bearing member and the first guide member and an increase in the amount of change of a dimension of a gap between the third bearing member and the first guide member are suppressed even if the second base is thermally deformed, for example. Therefore, the second base connected to the first bearing member and the third bearing member is also moved in the target trajectory relative to the direction parallel to the first axis.

The table device according to an aspect of the present invention includes a second guide member that is provided to the second base, and guides the table to the direction parallel to the second axis.

Therefore, the table is guided by the second guide member, and moved in the target trajectory relative to the direction parallel to the second axis.

The table device according to an aspect of the present invention includes: a fourth bearing member that is provided to the table, includes a fifth gas supply port facing the second reference surface, and a sixth gas supply port facing a third side surface of the second guide member, the third side surface facing a second direction parallel to the first axis, forms a gas bearing between the fourth bearing member and the second reference surface with a gas supplied through the fifth gas supply port, and forms a gas bearing between the fourth bearing member and the third side surface with a gas supplied through the sixth gas supply port; and a fifth bearing member that is provided to the table, includes a seventh gas supply port facing a fourth side surface of the second guide member, the fourth side surface facing an opposite direction to the second direction, and forms a gas bearing between the fifth bearing member and the third side surface with a gas supplied through the seventh supply port.

Therefore, the fourth bearing member is supported by the second reference surface and the second guide member in a non-contact manner, the fifth bearing member is supported by the second guide member in a non-contact manner, and the fourth bearing member and the fifth bearing member can be moved in the direction parallel to the second axis. The fourth bearing member forms the gas bearing that generates force (floating force) in the vertical direction with respect to the predetermined surface. That is, the fourth bearing member forms a so-called vertical-direction gas bearing (up-and-down-direction gas bearing). Further, the fourth bearing member and the fifth bearing member each form the corresponding gas bearing that generates force in the direction parallel to the first axis. That is, each of the fourth bearing member and the fifth bearing member forms a so-called horizontal-direction gas bearing. Accordingly, the fourth bearing member and the fifth bearing member are moved in the target trajectory relative to the direction parallel to the second axis while displacement of the fourth bearing member and the fifth bearing member in the direction parallel to the first axis is suppressed. Therefore, the table connected to the fourth bearing member and the fifth bearing member is also moved in the target trajectory relative to the direction parallel to the second axis.

The table device according to an aspect of the present invention includes a sixth bearing member that is provided to the table, apart from the fourth bearing member relative to the direction parallel to the first axis, includes an eighth gas supply port facing the second reference surface, and forms a gas bearing between the sixth bearing member and the second reference surface with a gas supplied through the eighth gas supply port.

Therefore, the fourth bearing member and the sixth bearing member are supported by the second reference surface in a non-contact manner, and the fourth bearing member and the sixth bearing member can be moved in the direction parallel to the second axis. The fourth bearing member and the sixth bearing member each form the corresponding gas bearing that generates force (floating force) in the vertical direction to the predetermined surface. That is, each of the fourth bearing member and the sixth bearing member forms a so-called vertical-direction gas bearing (up-and-down-direction gas bearings). Further, the fourth bearing member and the sixth bearing member are arranged apart from each other relative to the direction parallel to the first axis. A load of the table is supported by the gas bearing formed by the fourth bearing member and the gas bearing formed by the sixth bearing member, so that rolling of the table and the inclination of the upper surface of the table are suppressed. Therefore, the decrease in the positioning accuracy of the table is suppressed.

The table device according to an aspect of the present invention includes a suction force generation device that is arranged between the first base and the second base, and generates force to pull the second base to the first base.

Therefore, a dimension of a gap between the first bearing member and the first base and a dimension of a gap between the second bearing member and the first base are optimally maintained by balance between the floating force by the respective gas bearings formed by the first bearing member and the second bearing member with respect to the second base, and the suction force by a suction force generation device with respect to the second base. Therefore, the second base can be moved in the target trajectory.

In the table device according to an aspect of the present invention, the suction force generation device includes a first member connected to the first base, and a second member connected to the second base and capable of generating the force to pull the second base between the second member and the first member; the second member includes a first portion including a first lower surface facing the first member, and a second portion arranged above the first portion, and including a second lower surface, at least a part of the second lower surface extending to an outer side than the first portion; the second portion includes a hole connecting the second lower surface and an upper surface of the second member; and a fixing member for fixing the second member and the second base is arranged in the hole.

Therefore, for example, adjustment work of the suction force generation device is smoothly performed in a state where the table is arranged on the second base. Adjustment (change) of the suction force of the suction force generation device includes, for example, at least one of adjustment of a dimension of a gap between the first member and the second member, replacement of the second member, and adjustment of the number of the second members arranged in a position facing the first member. According to the present invention, the second member includes the first portion and the second portion, and the hole in which the fixing member is arranged is provided in the second portion. Therefore, the adjustment work of the suction force generation device is smoothly performed. Accordingly, balance between the floating force by the respective gas bearings formed by the first bearing member and the second bearing member with respect to the second base, and the suction force by the suction force generation device with respect to the second base is optimally adjusted. Therefore, at least one of a dimension of a gap between the first bearing member and the first base, a dimension of a gap between the second bearing member and the first base, rigidity of the gas bearing formed by the first bearing member, and rigidity of the gas bearing formed by the second bearing member is optimally adjusted. Therefore, the second base can be moved in the target trajectory, and the inclination of the second base is suppressed, for example. Therefore, the decrease in the positioning accuracy of the table supported by the second base is suppressed.

A table device according to an aspect of the present invention for achieving the above objective includes: a base including a reference surface parallel to a predetermined surface; a movable member movable on the reference surface; a bearing member that is provided to the movable member, includes a gas supply port facing the reference surface, and forms a gas bearing between the bearing member and the reference surface with a gas supplied through the gas supply port; and a suction force generation device that includes a first member connected to the base and a second member connected to the movable member, and generates force to pull the movable member to the base between the first member and the second member. The second member includes a first portion including a first lower surface facing the first member, and a second portion arranged above the first portion, and including a second lower surface, at least a part of the second lower surface extending to an outer side than the first portion; the second portion includes a hole connecting the second lower surface and an upper surface of the second member; and a fixing member for fixing the second member and the movable member is arranged in the hole.

Therefore, adjustment work of the suction force generation device is smoothly performed in a state where the movable member is arranged on the base. Adjustment (change) of suction force of the suction force generation device includes, for example, at least one of adjustment of a dimension of a gap between the first member and the second member, replacement of the second member, and adjustment of the number of the second members arranged in a position facing the first member. According to the present invention, the second member includes the first portion and the second portion, and the hole in which the fixing member is arranged is provided in the second portion. Therefore, the adjustment work of the suction force generation device is smoothly performed. Accordingly, balance between the floating force by the gas bearing formed by the bearing member with respect to the movable member, and the suction force by the suction force generation device with respect to the movable member is optimally adjusted. Therefore, at least one of a dimension of a gap between the bearing member and the base, and rigidity of the gas bearing formed by the bearing member is optimally adjusted. Therefore, the movable member is movable in the target trajectory, and the inclination of the movable member is suppressed, for example. Therefore, the decrease in the positioning accuracy of the movable member is suppressed.

A conveyance device according to an aspect of the present invention for achieving the above objective includes the table device.

Therefore, the conveyance device can convey an object supported by the table to a target position.

A semiconductor manufacturing device according to an aspect of the present invention for achieving the above objective includes the above-described table device.

Therefore, the semiconductor manufacturing device can process an object arranged in the target position. Therefore, manufacturing of a defective product from the object is suppressed. Note that the semiconductor manufacturing device includes an exposure device, for example, and is used in at least a part of a process of manufacturing a semiconductor device.

A flat panel display manufacturing device according to an aspect of the present invention for achieving the above objective includes the above-described table device.

Therefore, the flat panel display manufacturing device can process an object arranged in the target position. Therefore, manufacturing of a defective product from the object is suppressed. Note that the flat panel display manufacturing device includes an exposure device, for example, and is used in at least a part of a process of manufacturing a flat panel display. The flat panel display includes at least one of a liquid crystal display, a plasma display, and an organic EL display.

Advantageous Effects of Invention

According to the table device and the conveyance device of the present invention, the decrease in the positioning accuracy is suppressed.

BRIEF DESCRIPTION OF DRAWINGS

FIG. 3 is a plan view illustrating an example of the table device according to the present embodiment.

DESCRIPTION OF EMBODIMENTS

Hereinafter, embodiments according to the present invention will be described with reference to the drawings.

However, the present invention is not limited to the embodiments. Conditions of the embodiments described below can be appropriately combined. Further, there is a case where a part of configuration elements is not used. In the description below, an XYZ orthogonal coordinate system is provided, and positional relationships of respective units will be described with reference to the XYZ orthogonal coordinate system. One direction in a horizontal plane is an X axis direction, a direction perpendicular to the X axis direction in the horizontal plane is a Y axis direction, a direction perpendicular to the X axis direction and the Y axis direction (that is, a vertical direction) is a Z axis direction. Further, rotation (inclination) directions around an X axis, a Y axis, and a Z axis are θX, θY, and θZ directions, respectively. The X axis is perpendicular to a YZ plane. The Y axis is perpendicular to an XZ plane. The Z axis is perpendicular to an XY plane. The XY plane includes the X axis and the Y axis. The XZ plane includes the X axis and the Z axis. The YZ plane includes the Y axis and the Z axis. The XY plane is parallel to the horizontal plane.

<First Embodiment>

Figure 1:
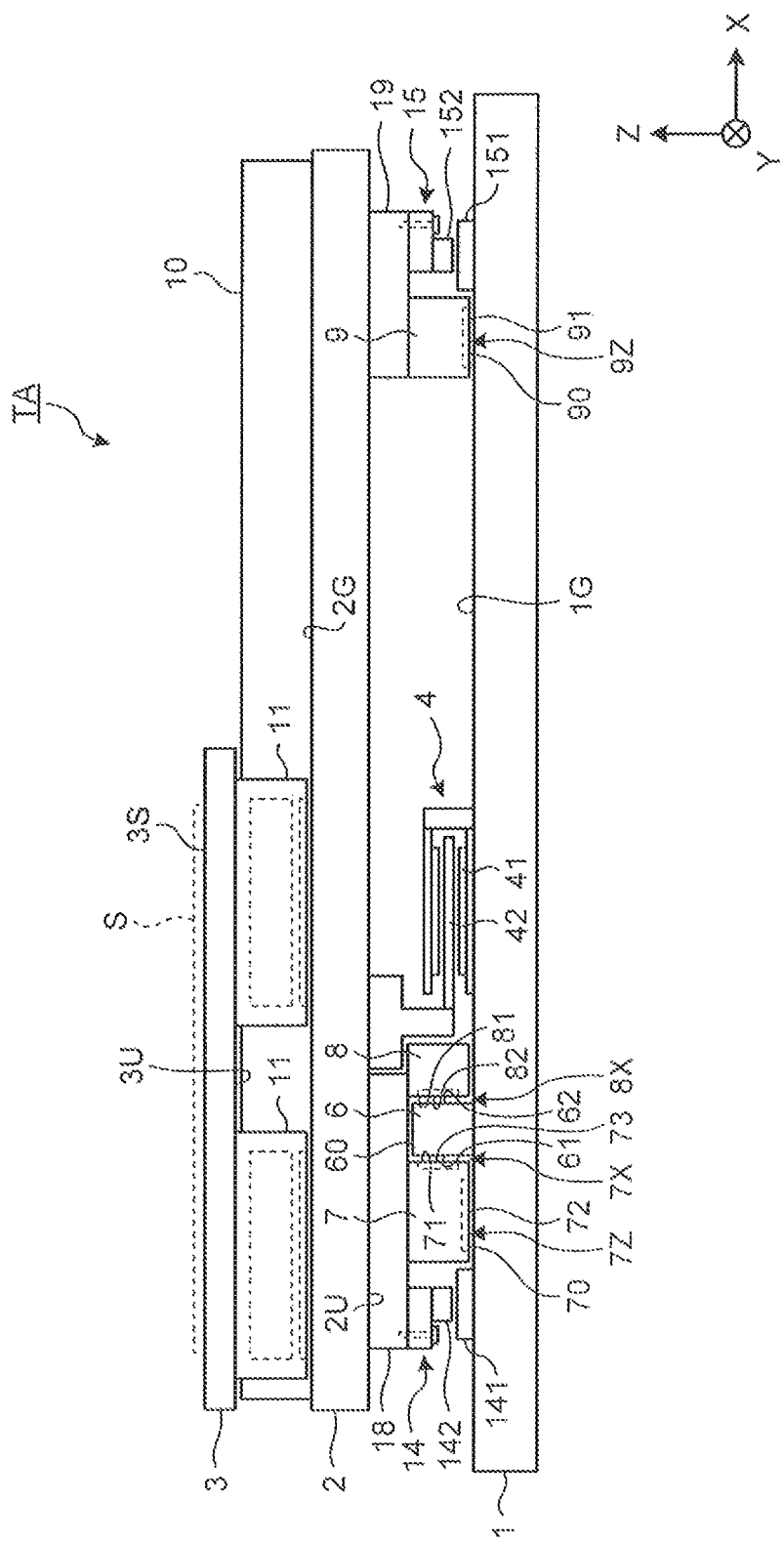
FIG. 1 is a side view illustrating an example of a table device according to the present embodiment.
Figure 2:
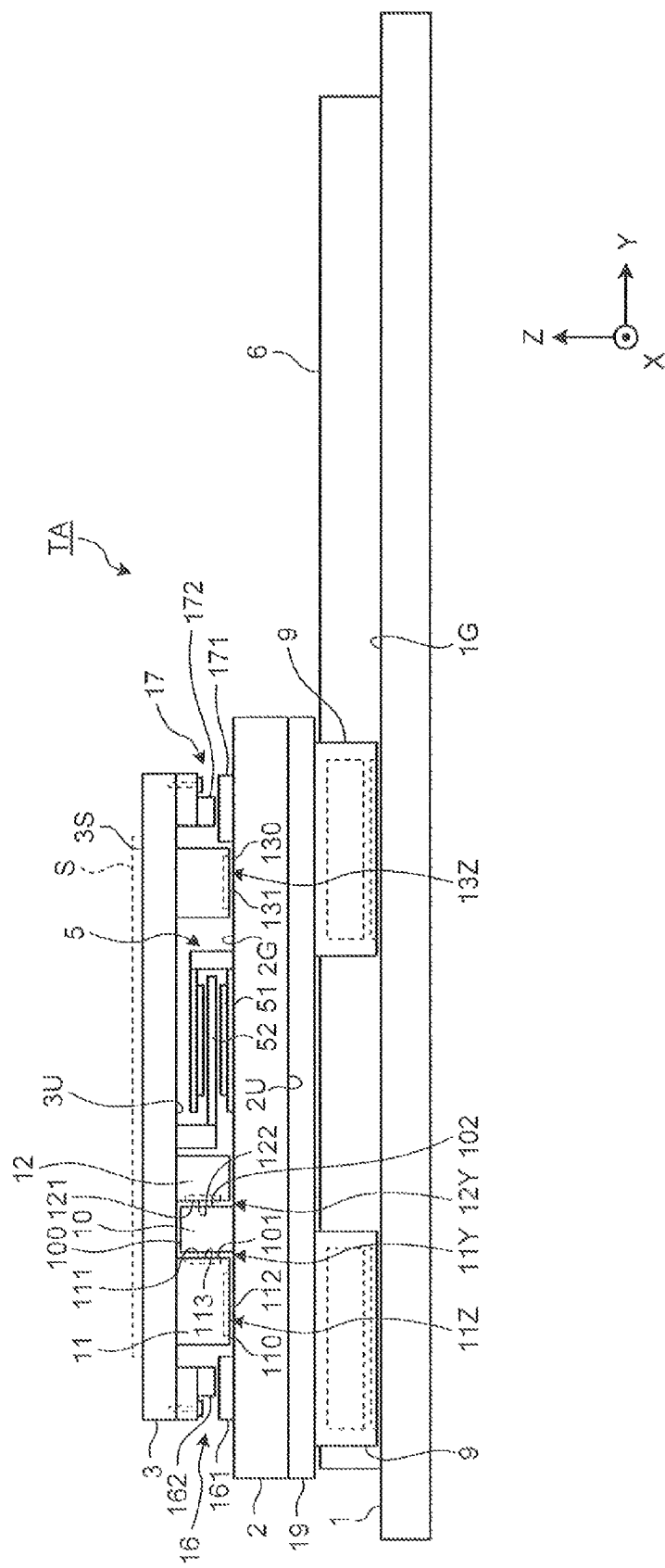
FIG. 2 is a side view illustrating an example of the table device according to the present embodiment.

A first embodiment will be described. FIGS. 1 and 2 are side views illustrating an example of a table device TA according to the present embodiment. FIG. 3 is a plan view illustrating an example of the table device TA according to the present embodiment. FIG. 1 is a side view of the table device TA as viewed from a −Y side. FIG. 2 is a side view of the table device TA as viewed from a +X side.

The table device TA includes a first base 1, a second base 2 movable on the first base 1, a table 3 movable on the second base 2, a drive device 4 for moving the second base 2 on the first base 1, and a drive device 5 for moving the table 3 on the second base 2.

Further, the table device TA includes a guide member 6, a bearing member 7, a bearing member 8, and a bearing member 9. The guide member 6 is provided on the first base 1, and guides the second base 2. The bearing member 7 is provided on the second base 2, and can form a gas bearing 7Z between the bearing member 7 and the first base 1 and can form a gas bearing 7X between the bearing member 7 and the guide member 6. The bearing member 8 is provided on the second base 2, and can form a gas bearing 8X between the bearing member 8 and the guide member 6. The bearing member 9 is provided on the second base 2, and can form a gas bearing 9Z between the bearing member 9 and the first base 1.

Further, the table device TA includes a guide member 10, a bearing member 11, a bearing member 12, and a bearing member 13. The guide member 10 is provided on the second base 2, and guides the table 3. The bearing member 11 is provided on the table 3, and can form a gas bearing 11Z between the bearing member 11 and the second base 2 and can form a gas bearing 11Y between the bearing member 11 and the guide member 10. The bearing member 12 is provided on the table 3, and can form a gas bearing 12Y between the bearing member 12 and the guide member 10. The bearing member 13 is provided on the table 3, and can form a gas bearing 13Z between the bearing member 13 and the second base 2.

Further, the table device TA includes a suction force generation device 14, a suction force generation device 15, a suction force generation device 16, and a suction force generation device 17. The suction force generation device 14 and the suction force generation device 15 are arranged between the first base 1 and the second base 2, and each generate force to pull the second base 2 to the first base 1. The suction force generation device 16 and the suction force generation device 17 are arranged between the second base 2 and the table 3, and each generate force to pull the table 3 to the second base 2.

The first base 1 includes a reference surface (an upper surface or a guide surface) 1G parallel to the XY plane. The first base 1 is arranged on a floor surface of a facility (for example, a factory) where the table device TA is installed. The first base 1 may contain a ceramic. The first base 1 may contain an alumina ($Al_2O_3$) ceramic, a mullite ($3Al_2O_3.2SiO_2$) ceramic, or a silicon nitride ($Si_3N_4$) ceramic. The first base 1 may contain stone.

The second base 2 is a movable member movable on the reference surface 1G of the first base 1. The first base 1 movably supports the second base 2. In the present embodiment, the second base 2 is moved on the reference surface 1G of the first base 1 in the Y axis direction. The second base 2 includes a reference surface (an upper surface or a guide surface) 2G parallel to the XY plane.

The table 3 can support an object S. The table 3 includes a support surface (upper surface) 3S that supports the object S. The table 3 is a movable member movable on the reference surface 2G of the second base 2. The second base 2 movably supports the table 3. In the present embodiment, the table 3 is moved on the reference surface 2G of the second base 2 in the X axis direction.

In the present embodiment, when the second base 2 is moved in the Y axis direction, the table 3 supported by the second base 2 is also moved in the Y axis direction together with the second base 2. That is, in the present embodiment, the table 3 can be moved in the two directions: the X axis direction and the Y axis direction. The table 3 is a so-called XY table (a two-axis table or two-dimensional table)

The guide member 6 is arranged on the reference surface 1G of the first base 1. The guide member 6 guides the second base 2 in the Y axis direction. The guide member 6 includes a rail long in the Y axis direction. The guide member 6 includes an upper surface 60 facing a +Z direction, a side surface 61 facing a −X direction, and a side surface 62 facing a +X direction. The side surface 62 faces an opposite direction to the side surface 61. The upper surface 60 is parallel to the XY plane. The side surface 61 and the side surface 62 are parallel to the YZ plane. Each of the upper surface 60, the side surface 61, and the side surface 62 is a plane. A thermal expansion coefficient (linear expansion coefficient) of the guide member 6 is substantially equal to a thermal expansion coefficient (linear expansion coefficient) of the first base 1. The guide member 6 may contain a ceramic or stone. The guide member 6 and the first base 1 may be formed of the same material.

The drive device 4 includes an actuator. The drive device 4 moves the second base 2 in the Y axis direction. In the present embodiment, the drive device 4 includes a linear motor. The drive device 4 includes a stator 41 connected to the first base 1 and a movable element 42 connected to the second base 2. The stator 41 may include a coil and the movable element 42 may include a magnet. The stator 41 may include a magnet and the movable element 42 may include a coil.

The bearing member 7 is supported by the second base 2. In the present embodiment, a support member 18 is fixed to a lower surface 2U of the second base 2. The bearing member 7 is fixed to the support member 18. In the present embodiment, the bearing member 7 is supported by (fixed to) the second base 2 through the support member 18. Note that the bearing member 7 may be directly fixed to the second base 2 without through the support member 18.

The bearing member 7 includes a lower surface 70 facing the reference surface 1G of the first base 1 and a side surface 71 facing the side surface 61 of the guide member 6. The lower surface 70 is parallel to the reference surface 1G (XY plane). The side surface 71 is parallel to the side surface 61 (YZ plane).

The bearing member 7 includes a supply port 72 and a supply port 73. The supply port 72 is arranged to face the reference surface 1G of the first base 1, and can supply a gas. The supply port 73 is arranged to face the side surface 61 of the guide member 6, and can supply a gas. The supply port 72 is arranged in at least a part of the lower surface 70. The gas bearing 7Z is formed between the reference surface 1G and the lower surface 70 with the gas supplied through the supply port 72. The supply port 73 is arranged in at least a part of the side surface 71. The gas bearing 7X is formed between the side surface 61 and the side surface 71 with the gas supplied through the supply port 73.

The bearing member 8 is supported by the second base 2. In the present embodiment, the bearing member 8 is fixed to the support member 18. In the present embodiment, the bearing member 8 is supported by (fixed to) the second base 2 through the support member 18. Note that the bearing member 8 may be directly fixed to the second base 2 without through the support member 18.

The bearing member 8 includes a side surface 81 facing the side surface 62 of the guide member 6. The side surface 81 is parallel to the side surface 62 (YZ plane).

The bearing member 8 includes a supply port 82. The supply port 82 is arranged to face the side surface 62 of the guide member 6, and can supply a gas. The supply port 82 is arranged in at least a part of the side surface 81. The gas bearing 8X is formed between the side surface 62 and the side surface 81 with the gas supplied through the supply port 82.

The bearing member 9 is supported by the second base 2. In the present embodiment, a support member 19 is fixed to the lower surface 2U of the second base 2. The bearing member 9 is fixed to the support member 19. In the present embodiment, the bearing member 9 is supported by (fixed to) the second base 2 through the support member 19. Note that the bearing member 9 may be directly fixed to the second base 2 without through the support member 19.

The bearing member 9 includes a lower surface 90 facing the reference surface 1G of the first base 1. The lower surface 90 is parallel to the reference surface 1G (XY plane).

The bearing member 9 includes a supply port 91. The supply port 91 is arranged to face the reference surface 1G of the first base 1, and can supply a gas. The supply port 91 is arranged in at least a part of the lower surface 90. The gas bearing 9Z is formed between the reference surface 1G and the lower surface 90 with the gas supplied through the supply port 91.

The bearing member 7 and the bearing member 9 are separated from each other relative to the X axis direction. The bearing member 7 is connected to one end portion (an end portion of a −X side) of the second base 2, and the bearing member 9 is connected to the other end portion (an end portion of the +X side) of the second base 2, relative to the X axis direction. The bearing member 8 and the drive device 4 are arranged between the bearing member 7 and the bearing member 9 relative to the X axis direction. The drive device 4 (movable element 42) is arranged in a substantially central portion of the second base 2 relative to the X axis direction. The bearing member 8 is arranged between the bearing member 7 and the guide member 6, and the drive device 4 (movable element 42), relative to the X axis direction. The guide member 6 is arranged between the bearing member 7 and the bearing member 8 relative to the X axis direction. The bearing member 7 is arranged at one side (−X side) of the guide member 6 and the bearing member 8 is arranged at the other side (+X side) of the guide member 6 relative to the X axis direction. The gas bearing 7Z (supply port 72) is arranged at a more −X side than the gas bearing 7X (supply port 73) and the gas bearing 8X (supply port 82). The gas bearing 9Z (supply port 91) is arranged at a more +X side than the gas bearing 7X (supply port 73) and the gas bearing 8X (supply port 82).

The bearing member 7 is arranged at an outer side (−X side) than the bearing member 8 with respect to a center of a space between the first base 1 and the second base 2. The gas bearing 7X (supply port 73) is arranged at an outer side (−X side) than the gas bearing 8X (supply port 82) with respect to the center of the space between the first base 1 and the second base 2. The gas bearing 7Z (supply port 72) is arranged at an outer side (−X side) than the gas bearing 7X (supply port 73) with respect to the center of the space between the first base 1 and the second base 2.

In the present embodiment, a plurality of the bearing members 7 is arranged relative to the Y axis direction. The plurality of bearing members 7 is separated from one another. In the present embodiment, two bearing members 7 are arranged relative to the Y axis direction. The two bearing members 7 are separated from each other. Similarly to the bearing members 7, a plurality of (two) bearing members 8 may be arranged relative to the Y axis direction, and a plurality of (two) bearing members 9 may be arranged relative to the Y axis direction.

The gas bearing 7Z and the gas bearing 9Z each generate force (floating force) in the Z axis direction. A load of the second base 2 relative to the Z axis direction is supported by the gas bearing 7Z and the gas bearing 9Z. That is, the gas bearing 7Z and the gas bearing 9Z are so-called vertical-direction gas bearings (up-and-down-direction gas bearings)

The gas bearing 7X and the gas bearing 8X each generate force in the X axis direction. A load of the second base 2 relative to the X axis direction is supported by the gas bearing 7X and the gas bearing 8X. That is, the gas bearing 7X and the gas bearing BX are so-called horizontal-direction gas bearings.

A gap is formed between the reference surface 10 and the lower surface 70 by the gas bearing 7Z. A gap is formed between the side surface 61 and the side surface 71 by the gas bearing 7X. A gap is formed between the side surface 62 and the side surface 81 by the gas bearing 8X. A gap is formed between the reference surface 1G and the lower surface 90 by the gas bearing 9Z. Further, a gap is formed between the support member 18 (second base 2) and the upper surface 60 of the guide member 6 by the gas bearing 7Z and the gas bearing 9Z. Accordingly, the second base 2 is supported by the first base 1 and the guide member 6 in a non-contact manner. The second base 2 is moved in the Y axis direction when the drive device 4 is operated in the state where the second base 2 is supported by the first base 1 and the guide member 6 in a non-contact manner.

The suction force generation device 14 and the suction force generation device 15 each generate force to pull the second base 2 to the first base 1. The suction force generation device 14 is arranged next to the bearing member 7. The suction force generation device 14 is arranged at an outer side (−X side) than the bearing member 7 with respect to the center of the space between the first base 1 and the second base 2. The suction force generation device 15 is arranged next to the bearing member 9. The suction force generation device 15 is arranged at an outer side (+X side) than the bearing member 9 with respect to the center of the space between the first base 1 and the second base 2.

The suction force generation device 14 includes a first member 141 and a second member 142. The first member 141 is connected to the first base 1. The second member 142 is connected to the second base 2, and generates force to pull the second base 2 to the first base 1 between the second member 142 and the first member 141. In the present embodiment, the second member 142 includes a magnet and the first member 141 includes a magnetic body like metal. The second base 2 is pulled to the first base 1 by the magnetic force generated between the first member 141 and the second member 142. Similarly to the suction force generation device 14, the suction force generation device 15 includes a first member 151 and a second member 152. The first member 151 is connected to the first base 1. The second member 152 is connected to the second base 2, and generates force to pull the second base 2 to the first base 1 between the second member 152 and the first member 151. The first member 141 is connected to one end portion (end portion of the −X side) of the first base 1, and the first member 151 is connected to the other end portion (end portion of the +X side) of the first base 1, relative to the X axis direction. The second member 142 is connected to one end portion (end portion of the −X side) of the second base 2, and the second member 152 is connected to the other end portion (end portion of the +X side) of the second base 2, relative to the X axis direction.

The gas bearing 7Z generates force (floating force) to move the bearing member 7 (second base 2) in the +Z direction with respect to the first base 1, and the gas bearing 9Z generates force to move the bearing member 9 (second base 2) in the +Z direction with respect to the first base 1. The suction force generation device 14 generates force (suction force) to move the second base 2 in the −Z direction with respect to the first base 1, and the suction force generation device 15 generates force to move the second base 2 in the −Z direction with respect to the first base 1. The gap between the reference surface 13 and the lower surface 70, and the gap between the reference surface 1G and the lower surface 90 are maintained by balance between the floating force of the gas bearing 7Z and the gas bearing 9Z, and the suction force of the suction force generation device 14 and the suction force generation device 15, and displacement of the second base 2 relative to the Z axis direction is suppressed.

The gas bearing 7X generates force (repulsive force) to move the bearing member 7 (second bae 2) in the −X direction with respect to the guide member 6. The gas bearing 8X generates force (repulsive force) to move the bearing member 8 (second base 2) in the +X direction with respect to the guide member 6. The gap between the side surface 61 and the side surface 71, and the gap between the side surface 62 and the side surface 81 are maintained by balance between the repulsive force of the gas bearing 7X and the repulsive force of the gas bearing BX, and relative displacement between the first base 1 and the second base 2 relative to the X axis direction is suppressed.

The guide member 10 is arranged on the reference surface 2G of the second base 2. The guide member 10 guides the table 3 in the X axis direction. The guide member 10 includes a rail long in the X axis direction. The guide member 10 includes an upper surface 100 facing the +Z direction, a side surface 101 facing a −Y direction, and a side surface 102 facing a +Y direction. The side surface 102 faces an opposite direction to the side surface 101. The upper surface 100 is parallel to the XY plane. The side surface 101 and the side surface 102 are parallel to the XZ plane. Each of the upper surface 100, the side surface 101, and the side surface 102 is a plane. A thermal expansion coefficient (linear expansion coefficient) of the guide member 10 is substantially equal to a thermal expansion coefficient (linear expansion coefficient) of the second base 2. The guide member 10 and the second base 2 may be formed of the same material.

The drive device 5 includes an actuator. The drive device 5 moves the table 3 in the X axis direction. In the present embodiment, the drive device 5 includes a linear motor. The drive device 5 includes a stator 51 connected to the second base 2 and a movable element 52 connected to the table 3. The stator 51 may include a coil and the movable element 52 may include a magnet. The stator 51 may include a magnet and the movable element 52 may include a coil.

The bearing member 11 is supported by the table 3. The bearing member 11 is fixed to a lower surface 3U of the table 3.

The bearing member 11 includes a lower surface 110 facing the reference surface 2G of the second base 2 and a side surface 111 facing the side surface 101 of the guide member 10. The lower surface 110 is parallel to the reference surface 2G (XY plane). The side surface 111 is parallel to the side surface 101 (XZ plane).

The bearing member 11 includes a supply port 112 and a supply port 113. The supply port 112 is arranged to face the reference surface 2G of the second base 2, and can supply a gas. The supply port 113 is arranged to face the side surface 101 of the guide member 10, and can supply a gas. The supply port 112 is arranged in at least a part of the lower surface 110. A gas bearing 11Z is formed between the reference surface 2G and the lower surface 110 with the gas supplied through the supply port 112. The supply port 113 is arranged in at least a part of the side surface 111. A gas bearing 11Y is formed between the side surface 101 and the side surface 111 with the gas supplied through the supply port 113.

The bearing member 12 is supported by the table 3. In the present embodiment, the bearing member 12 is fixed to the lower surface 3U of the table 3.

The bearing member 12 includes a side surface 121 facing the side surface 102 of the guide member 10. The side surface 121 is parallel to the side surface 102 (XZ plane).

The bearing member 12 includes a supply port 122. The supply port 122 is arranged to face the side surface 102 of the guide member 10, and can supply a gas. The supply port 122 is arranged in at least a part of the side surface 121. A gas bearing 12Y is formed between the side surface 102 and the side surface 121 with the gas supplied through the supply port 122.

The bearing member 13 is supported by the table 3. In the present embodiment, the bearing member 13 is fixed to the lower surface 3U of the table 3.

The bearing member 13 includes a lower surface 130 facing the reference surface 2G of the second base 2. The lower surface 130 is parallel to the reference surface 2G (XY plane).

The bearing member 13 includes a supply port 131. The supply port 131 is arranged to face the reference surface 2G of the second base 2, and can supply a gas. The supply port 131 is arranged in at least a part of the lower surface 130. A gas bearing 13Z is formed between the reference surface 2G and the lower surface 130 with the gas supplied through the supply port 131.

The bearing member 11 and the bearing member 13 are separated from each other relative to the Y axis direction. The bearing member 11 is connected to one end portion (end portion of the −Y side) of the table 3, and the bearing member 13 is connected to the other end portion (end portion of the +Y side) of the table 3, relative to the Y axis direction. The bearing member 12 and the drive device 5 are arranged between the bearing member 11 and the bearing member 13 relative to the Y axis direction. The drive device 5 (movable element 52) is arranged in a substantially center portion of the table 3 relative to the Y axis direction. The bearing member 12 is arranged between the bearing member 11 and the guide member 10, and the drive device 5 (movable element 52), relative to the Y axis direction. The guide member 10 is arranged between the bearing member 11 and the bearing member 12 relative to the Y axis direction. The bearing member 11 is arranged at one side (−Y side) of the guide member 10, and the bearing member 12 is arranged at the other side (+Y side) of the guide member 10 relative to the Y axis direction. The gas bearing 11Z (supply port 112) is arranged at a more −Y side than the gas bearing 11Y (supply port 113) and the gas bearing 12Y (supply port 122). The gas bearing 13Z (supply port 131) is arranged at a more +Y side than the gas bearing 11Y (supply port 113) and the gas bearing 12Y (supply port 122).

The bearing member 11 is arranged at an outer side (−Y side) than the bearing member 12 with respect to a center of a space between the second base 2 and the table 3. The gas bearing 11Y (supply port 113) is arranged at an outer side (−Y side) than the gas bearing 12Y (supply port 122) with respect to the center of the space between the second base 2 and the table 3. The gas bearing 11Z (supply port 112) is arranged at an outer side (−Y side) than the gas bearing 11Y (supply port 113) with respect to the center of the space between the second base 2 and the table 3.

In the present embodiment, a plurality of the bearing members 11 is arranged relative to the X axis direction. The plurality of bearing members 11 is separated from one another. In the present embodiment, two bearing members 11 are arranged relative to the X axis direction. The two bearing members 11 are separated from each other. Similarly to the bearing members 11, a plurality of (two) bearing members 12 may be arranged relative to the X axis direction, or a plurality of (two) bearing members 13 may be arranged relative to the X axis direction.

The gas bearing 11Z and the gas bearing 13Z generate force (floating force) in the Z axis direction. A load of the table 3 relative to the Z axis direction is supported by the gas bearing 11Z and the gas bearing 132. That is, the gas bearing 11Z and the gas bearing 13Z are so-called vertical-direction gas bearings (up-and-down-direction gas bearings).

The gas bearing 11Y and the gas bearing 12Y generate force in the Y axis direction. A load of the table 3 relative to the Y axis direction is supported by the gas bearing 11Y and the gas bearing 12Y. That is, the gas bearing 11Y and the gas bearing 12Y are so-called horizontal-direction gas bearings.

A gap is formed between the reference surface 2G and the lower surface 110 by the gas bearing 11Z. A gap is formed between the side surface 101 and the side surface 111 by the gas bearing 11Y. A gap is formed between the side surface 102 and the side surface 121 by the gas bearing 12Y. A gap is formed between the reference surface 2G and the lower surface 130 by the gas bearing 13Z. Further, a gap is formed between the table 3 and the upper surface 100 of the guide member 10 by the gas bearing 11Z and the gas bearing 13Z. Accordingly, the table 3 is supported by the second base 2 and the guide member 10 in a non-contact manner. The table 3 is moved in the X axis direction when the drive device 5 is operated in the state where the table 3 is supported by the second base 2 and the guide member 10 in a non-contact manner.

The suction force generation device 16 and the suction force generation device 17 each generate force to pull the table 3 to the second base 2. The suction force generation device 16 is arranged next to the bearing member 11. The suction force generation device 16 is arranged at an outer side (−Y side) than the bearing member 11 with respect to the center of the space between the second base 2 and the table 3. The suction force generation device 17 is arranged next to the bearing member 13. The suction force generation device 17 is arranged at an outer side (+Y side) than the bearing member 13 with respect to the center of the space between the second base 2 and the table 3.

The suction force generation device 16 includes a first member 161 and a second member 162. The first member 161 is connected to the second base 2. The second member 162 is connected to the table 3, and generates force to pull the table 3 to the second base 2 between the second member 162 and the first member 161. In the present embodiment, the second member 162 includes a magnet and the first member 161 includes a magnetic body like metal. The table 3 is pulled to the second base 2 by the magnetic force generated between the first member 161 and the second member 162. Similarly to the suction force generation device 16, the suction force generation device 17 includes a first member 171 and a second member 172. The first member 171 is connected to the second base 2. The second member 172 is connected to the table 3, and generates force to pull the table 3 to the second base 2 between the second member 172 and the first member 171. The first member 161 is connected to one end portion (end portion of the −Y side) of the second base 2, and the first member 171 is connected to the other end portion (end portion of the +Y side) of the second base 2, relative to the Y axis direction. The second member 162 is connected to one end portion (end portion of the −Y side) of the table 3, and the second member 172 is connected to the other end portion (end portion of the +Y side) of the table 3, relative to the Y axis direction.

The gas bearing 11Z generates force (floating force) to move the bearing member 11 (table 3) in the +Z direction with respect to the second base 2. The gas bearing 13Z generates force (floating force) to move the bearing member 13 (table 3) in the +Z direction with respect to the second base 2. The suction force generation device 16 generates force (suction force) to move the table 3 in the −Z direction with respect to the second base 2. The suction force generation device 17 generates force (suction force) to move the table 3 in the −Z direction with respect to the second base 2. The gap between the reference surface 2G and the lower surface 110, and the gap between the reference surface 2G and the lower surface 130 are maintained by balance between the floating force of the gas bearing 11Z and the gas bearing 13Z and the suction force of the suction force generation device 16 and the suction force generation device 17, and displacement of the table 3 relative to the Z axis direction is suppressed.

The gas bearing 11Y generates force (repulsive force) to move the bearing member 11 (table 3) in the −Y direction with respect to the guide member 10. The gas bearing 12Y generates force (repulsive force) to move the bearing member 12 (table 3) in the +Y direction with respect to the guide member 10. The gap between the side surface 101 and the side surface 111, and the gap between the side surface 102 and the side surface 121 are maintained by balance between the repulsive force of the gas bearing 1Y and the repulsive force of the gas bearing 12Y, and relative displacement between the second base 2 and the table 3 relative to the Y axis direction is suppressed.

In the present embodiment, the bearing member 7 may contain porous body (porous member) and the supply port 72 may include a hole of the porous body. That is, a throttle type of the bearing member 7 for forming the gas bearing 7Z may be a so-called porous throttle type. The porous body may be made of graphite (carbon graphite) as disclosed in Japanese Patent No. 5093056 and Japanese Laid-open Patent Publication No. 2007-120527. The porous body may be a ceramic. The throttle type of the bearing member 7 for forming the gas bearing 7Z may be a self-throttle type without using the porous body, may be an orifice throttle type, or may be a surface throttle type of supplying a gas through a groove provided in a bearing surface. For example, in the case of an orifice throttle type bearing member 7, the supply port 72 that supplies a gas includes an opening of orifice. The throttle type for forming the gas bearing 7X, the gas bearing 8X, the gas bearing 9Z, the gas bearing 11Z, the gas bearing 11Y, the gas bearing 12Y, and the gas bearing 13Z may be the porous throttle type, the self-throttle type, the orifice throttle type, or the surface throttle type.

Next, an example of an operation of the above-described table device TA will be described. At least one of the drive device 4 and the drive device 5 is operated in the state where the second base 2 is supported by the first base 1 and the guide member 6 in a non-contact manner, and where the table 3 is supported by the second base 2 and the guide member 10 in a non-contact manner. The second base 2 is moved by the operation of the drive device 4. The second base 2 is moved together with the movable element 42, the bearing member 7, the bearing member 8, the bearing member 9, the second member 142, and the second member 152. The table 3 is moved by the operation of the drive device 5. The table 3 is moved together with the movable element 52, the bearing member 11, the bearing member 12, the bearing member 13, the second member 162, and the second member 172.

Each of the bearing members 7 and 8 may be called a slide member, the bearing members 7 and 8 having at least a part facing the guide member 6, and being moved with respect to the guide member 6. Each of the bearing members 11 and 12 having at least a part facing the guide member 10, and moved with respect to the guide member 10 may be called a slide member.

For example, the second base 2 is moved in the Y axis direction with respect to the first base 1 by the operation of the drive device 4. The table 3 supported by the second base 2 is also moved in the Y axis direction together with the second base 2 by the movement of the second base 2 relative to the Y axis direction. Further, the table 3 is moved in the X axis direction with respect to the second base 2 by the operation of the drive device 5.

In the present embodiment, the guide member 6 is fixed to the first base 1, and the gas bearing 7X and the gas bearing 8X are formed. Therefore, the relative displacement between the first base 1 and the second base 2 relative to the X axis direction is suppressed, and the second base 2 can be moved in the Y axis direction. Further, in the present embodiment, the guide member 10 is fixed to the second base 2, and the gas bearing 11Y and the gas bearing 12Y are formed. Therefore, relative displacement between the second base 2 and the table 3 relative to the Y axis direction is suppressed, and the table 3 can be moved in the X axis direction.

Figure 4:
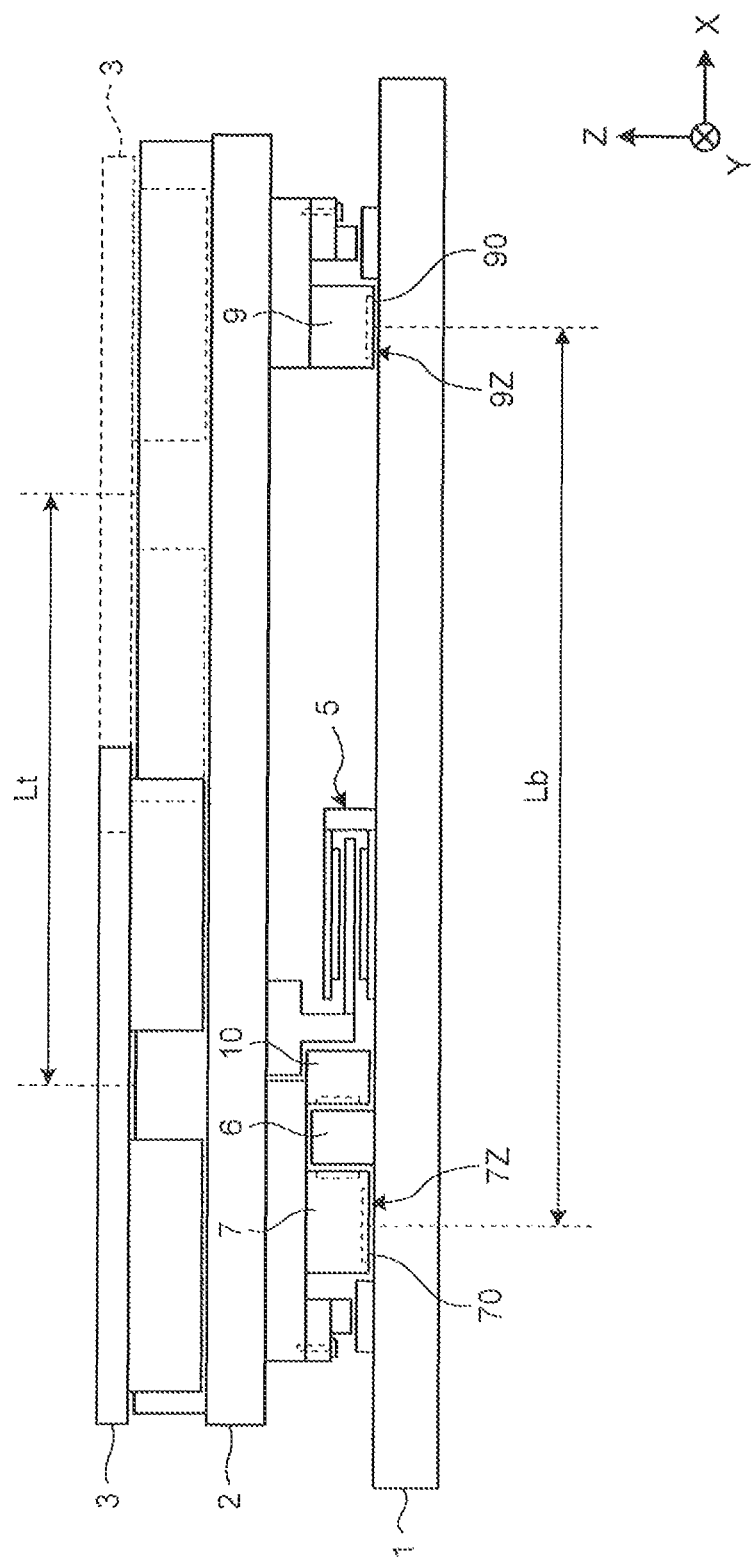
FIG. 4 is a diagram illustrating an example of an operation of the table device according to the present embodiment.

FIG. 4 illustrates an example of a state where the table 3 is moved in the X axis direction. In the present embodiment, a distance Lb between the bearing member 7 and the bearing member 9 relative to the X axis direction is longer than a dimension Lt of a moving range of the table 3 relative to the X axis direction.

The distance Lb includes a distance between a center of the lower surface 70 and a center of the lower surface 90 relative to the X axis direction. The distance Lb includes a distance between a center of the gas bearing 7Z and a center of the gas bearing 9Z relative to the X axis direction.

The dimension Lt includes a dimension of a movable range (stroke) of the table 3 relative to the X axis direction. The dimension Lt includes a distance between the center of gravity of the table 3 of when the table 3 is moved to the most −X side in the moving range and the center of gravity of the table 3 of when the table 3 is moved to the most +X side in the moving range, relative to the X axis direction.

In the present embodiment, the moving range of the table 3 is determined such that the center of gravity of the table 3 is moved between the bearing member 7 (gas bearing 72) and the bearing member 9 (gas bearing 9Z) relative to the X axis direction. In other words, the moving range of the table 3 relative to the X axis direction is determined such that the center of gravity of the table 3 is not arranged at a more −X side than the bearing member 7, and is not arranged at a more +X side than the bearing member 9, in the movement of the table 3. Note that a center between the bearing member 7 and the bearing member 9 and a center of the moving range of the table 3 may be at the same position relative to the X axis direction.

Accordingly, pitching of the table 3 and inclination of the upper surface 3S of the table 3 are suppressed in the moving range of the table 3 relative to the X axis direction. Note that the pitching of the table 3 refers to a phenomenon in which the table 3 proceeding in the X axis direction is rotated (inclined) in a direction around the Y axis (that is, a BY direction) perpendicular to the proceeding direction (X axis direction).

Figure 5:
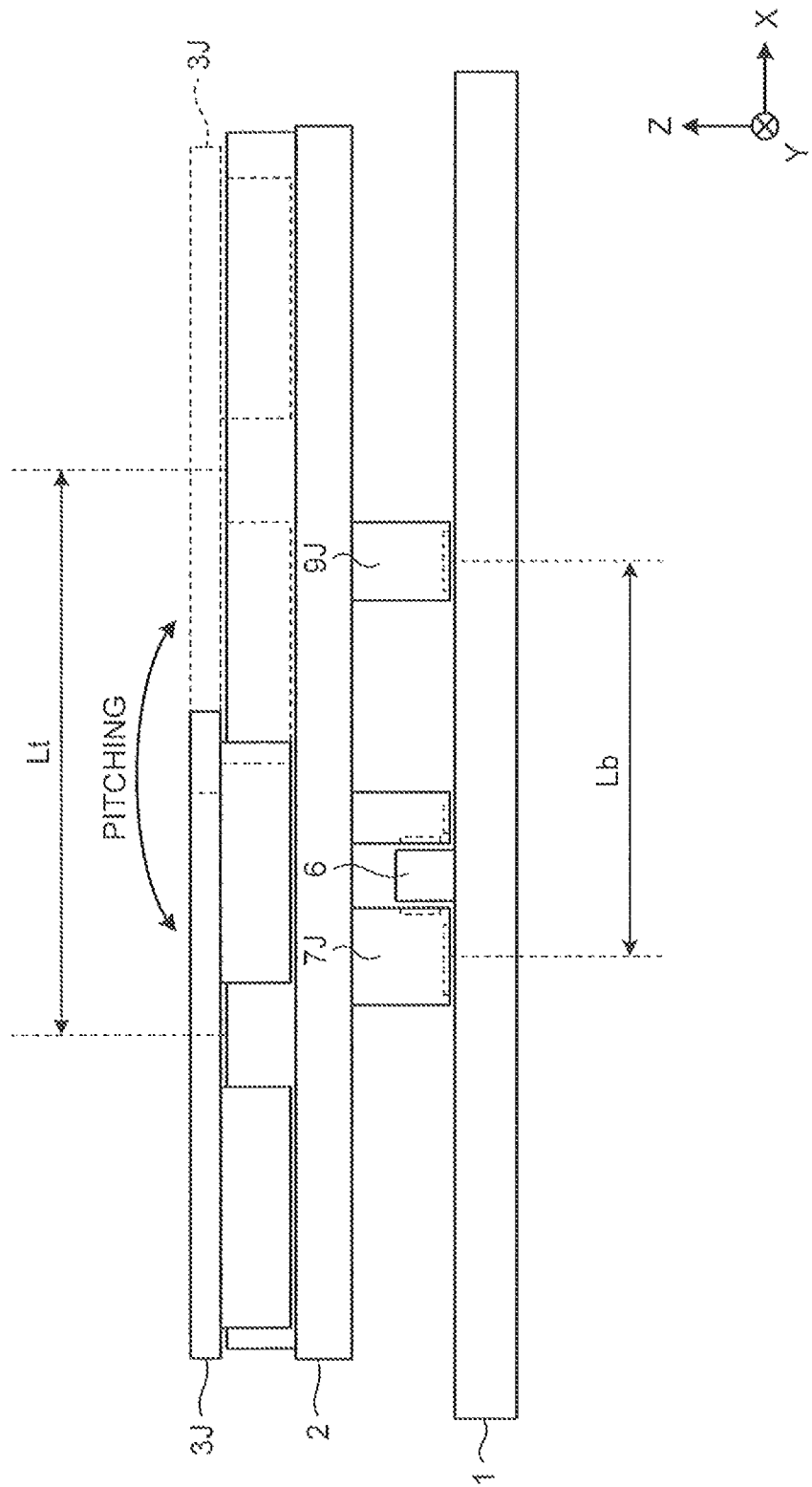
FIG. 5 is a diagram illustrating a table device according to a comparative example.

FIG. 5 is a schematic view illustrating an example of a comparative example. In FIG. 5, a distance Lb between a bearing member 7J and a bearing member 9J is shorter than a dimension of a moving range of a table 3J relative to the X axis direction. In at least a part of the moving range of the table 3J, the center of gravity of the table 3J is moved to a more −X side than the bearing member 7J, and is moved to a more +X side than the bearing member 9J. In this case, a possibility that the table 3J is pitched becomes high.

In the present embodiment, the distance Lb between the bearing member 7 and the bearing member 9 relative to the X axis direction is longer than the dimension Lt of the moving range of the table 3 relative to the X axis direction. Therefore, the pitching of the table 3 is suppressed.

As described above, in the table device TA in which the second base 2 is moved on the reference surface 1G of the first base 1 in the Y axis direction, and the table 3 is moved on the reference surface 2G of the second base 2 in the X axis direction, the distance Lb between the bearing member 7 and the bearing member 9 relative to the X axis direction is longer than the dimension Lt of the moving range of the table 3 relative to the X axis direction. Therefore, even if the table 3 is moved in the moving range of the table 3, the load of the table 3 is supported by the gas bearing 7Z formed by the bearing member 7 and the gas bearing 9Z formed by the bearing member 9. Accordingly, in the moving range of the table 3, the pitching of the table 3 and the inclination of the upper surface 3S of the table 3 with respect to the XY plane are suppressed. Therefore, the decrease in the positioning accuracy of the table 3 is suppressed.

Further, in the present embodiment, the moving range of the table 3 is determined such that the center of gravity of the table 3 is moved between the bearing member 7 and the bearing member 9 relative to the X axis direction. That is, the center of gravity of the table 3 is not moved outside the range between the bearing member 7 (gas bearing 7Z) and the bearing member 9 (gas bearing 9Z). Therefore, even if the table 3 is moved in the moving range, the load of the table 3 is supported by the gas bearing 7Z and the gas bearing 9Z. Accordingly, the pitching of the table 3 and the inclination of the upper surface 3S of the table 3 with respect to the XY plane are suppressed.

Further, in the present embodiment, the guide member 6 is provided, and the gas bearing 7X and the gas bearing 8X are formed at either side, respectively, of the guide member 6 relative to the X axis direction. The gas bearing 7X generates the repulsive force that moves the second base 2 in the −X direction with respect to the guide member 6, and the gas bearing 8X generates the repulsive force that moves the second base 2 in the +X direction with respect to the guide member 6. The gap between the side surface 61 and the side surface 71 and the gap between the side surface 62 and the side surface 81 are maintained by the balance between the repulsive force of the gas bearing 7X and the repulsive force of the gas bearing 8X, and the relative displacement between the first base 1 and the second base 2 relative to the X axis direction is suppressed. Therefore, the second base 2 is guided by the guide member 6, and is moved in a target trajectory relative to the Y axis direction. For example, the second base 2 can be moved straight in the Y axis direction. Accordingly, the table 3 supported by the second base 2 is also moved in the target trajectory relative to the Y axis direction.

Further, in the present embodiment, the gas bearing 7X and the gas bearing BX are arranged at either side, respectively, of the guide member 6 relative to the X axis direction, and the distance between the gas bearing 7X and the gas bearing 8X relative to the X axis direction is short. Therefore, even if the second base 2 is thermally deformed, an increase in the amount of change of the relative distance between the bearing member 7 and the bearing member 8 is suppressed. Therefore, even if the second base 2 is thermally deformed, large change of the dimension of the gap between the side surface 71 of the bearing member 7 and the side surface 61 of the guide member 6, and large change of the dimension of the gap between the side surface 81 of the bearing member 8 and the side surface 62 of the guide member 6 are suppressed. Therefore, a decrease in performance of the gas bearing 7X and a decrease in performance of the gas bearing 8X are suppressed, and the second base 2 connected to the bearing member 7 and the bearing member 8 is moved in the target trajectory relative to the Y axis direction.

Further, in the present embodiment, the guide member 10 is provided, and the gas bearing 11Y and the gas bearing 12Y are formed at either side, respectively, of the guide member 10 relative to the Y axis direction. The gas bearing 11Y generates the repulsive force that moves the table 3 in the −Y direction with respect to the guide member 10, and the gas bearing 12Y generates the repulsive force that moves the table 3 in the +Y direction with respect to the guide member 10. The gap between the side surface 101 and the side surface 111 and the gap between the side surface 102 and the side surface 121 are maintained by the balance between the repulsive force of the gas bearing 11Y and the repulsive force of the gas bearing 12Y, and the relative displacement between the second base 2 and the table 3 relative to the Y axis direction is suppressed. Therefore, the table 3 is guided by the guide member 10 and is moved in the target trajectory relative to the X axis direction. For example, the table 3 can be moved straight in the X axis direction.

Further, in the present embodiment, the gas bearing 11Y and the gas bearing 12Y are arranged at either side, respectively, of the guide member 10 relative to the Y axis direction, and the distance between the gas bearing 11Y and the gas bearing 12Y relative to the Y axis direction is short. Therefore, even if the table 3 is thermally deformed, for example, an increase in the amount of change of the relative distance between the bearing member 11 and the bearing member 12 is suppressed. Therefore, even if the table 3 is thermally changed, large change of the dimension of the gap between the side surface 111 of the bearing member 11 and the side surface 101 of the guide member 10, and large change of the dimension of the gap between the side surface 121 of the bearing member 12 and the side surface 102 of the guide member 10 are suppressed. Therefore, a decrease in performance of the gas bearing 11Y and a decrease in performance of the gas bearing 12Y are suppressed, and the table 3 connected to the bearing member 11 and the bearing member 12 is moved in the target trajectory relative to the X axis direction.

Further, in the present embodiment, the gas bearing 11Z and the gas bearing 13Z are arranged apart from each other relative to the Y axis direction. Since the load of the table 3 is supported by the gas bearing 11Z and the gas bearing 13Z, rolling of the table 3 and the inclination of the upper surface 3S of the table 3 with respect to the XY plane are suppressed. Therefore, the decrease in the positioning accuracy of the table 3 is suppressed. Note that the rolling of the table 3 is a phenomenon in which the table 3 proceeding in the X axis direction is rotated (inclined) in a direction around the X axis (that is, a OX direction) parallel to the proceeding direction.

Further, in the present embodiment, the gap between the reference surface 1G and the lower surface 70 and the gap between the reference surface 1G and the lower surface 90 are maintained by the balance between the floating force of the gas bearing 7Z and the gas bearing 9Z and the suction force of the suction force generation device 14 and the suction force generation device 15, and the relative displacement between the first base 1 and the second base 2 relative to the Z axis direction is suppressed. Therefore, the second base 2 is moved in the target trajectory. For example, the second base 2 can be moved straight in the Y axis direction. Accordingly, the table 3 supported by the second base 2 is moved in the target trajectory.

Further, in the present embodiment, the gap between the reference surface 2G and the lower surface 110 and the gap between the reference surface 23 and the lower surface 130 are maintained by the balance between the floating force of the gas bearing 11Z and the gas bearing 13Z and the suction force of the suction force generation device 16 and the suction force generation device 17, and the relative displacement between the second base 2 and the table 3 relative to the Z axis direction is suppressed. Therefore, the table 3 is moved in the target trajectory. For example, the table 3 can be moved straight in the X axis direction.

Further, in the present embodiment, the suction force generation device 14 is arranged next to (in the vicinity of) the bearing member 7. Therefore, an increase in shear force acting on the second base 2 is suppressed by the floating force by the gas bearing 7Z and the suction force by the suction force generation device 14. Similarly, the suction force generation device 15 is arranged next to (in the vicinity of) the bearing member 9. Therefore, an increase in shear force acting on the second base 2 is suppressed by the floating force by the gas bearing 9Z and the suction force by the suction force generation device 15. The suction force generation device 16 is arranged next to (in the vicinity of) the bearing member 11. Therefore, an increase in shear force acting on the table 3 is suppressed by the floating force by the gas bearing 11Z and the suction force by the suction force generation device 16. The suction force generation device 17 is arranged next to (in the vicinity of) the bearing member 13. Therefore, an increase in shear force acting on the table 3 is suppressed by the floating force by the gas bearing 13Z and the suction force by the suction force generation device 17.

<Second Embodiment>

A second embodiment will be described. In the description below, the same or equivalent configuration portion as/to the above embodiment will be denoted with the same reference sign, and description thereof is simplified or omitted.

Figure 6:
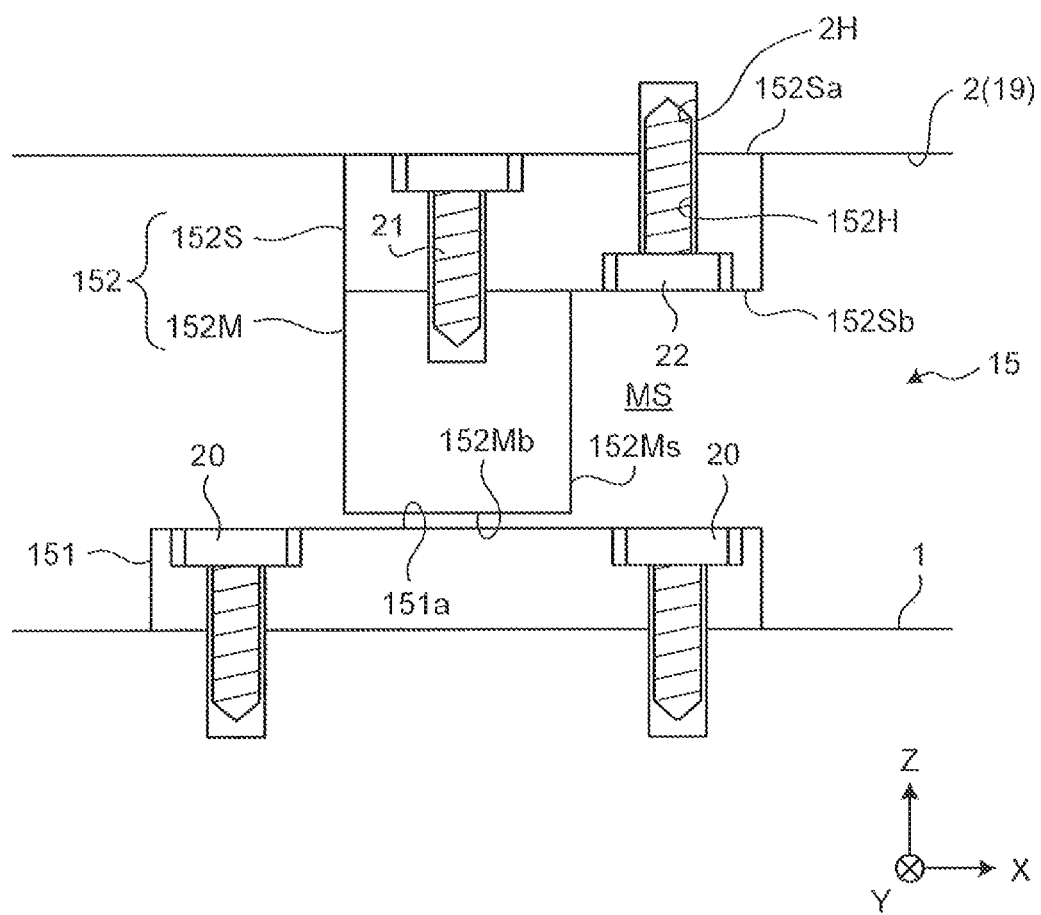
FIG. 6 is a diagram illustrating an example of a suction force generation device according to the present embodiment.

FIG. 6 is a diagram illustrating an example of a suction force generation device 15. Note that a suction force generation device 14, the suction force generation device 15, a suction force generation device 16, and a suction force generation device 17 have an equivalent structure. Hereinafter, the suction force generation device 15 will be mainly described, and description of the suction force generation device 14, the suction force generation device 16, and the suction force generation device 17 is simplified or omitted.

The suction force generation device 15 includes a first member 151 a second member 152. The first member 151 is connected to a first base 1. The second member 152 is connected to a second base 2, and generates force to pull the second base 2 to the first base 1 between the second member 152 and the first member 151. The first member 151 includes a rail made of a magnetic body (ferromagnetic body). The first member 151 is long in a Y axis direction. The first member 151 is fixed to the first base 1 with a fixing member 20 like a bolt.

The second member 152 is arranged above the first member 151. The first member 151 and the second member 152 face each other through a gap. The first member 151 and the second member 152 are in a non-contact state, and generate force to pull the second base 2 to the first base 1 (suction force). A plurality of the second members 152 may be arranged in the Y axis direction. The plurality of second members 152 may be separated from one another.

In the present embodiment, the second member 152 includes a portion 152M and a portion 152S. The portion 152M includes a lower surface 152Mb facing the first member 151. The portion 152S is arranged on the portion 152M, and includes a lower surface 152Sb having at least a part thereof extending to an outer side than the portion 152M. The portion 152S is arranged between the portion 152M and the second base 2 (support member 19). The portion 152S is connected to the second base 2 (support member 19).

In the present embodiment, the second member 152 includes a magnet (permanent magnet) and a spacer member that supports the magnet. In the present embodiment, the portion 152M includes the magnet and the portion 152S includes the spacer member. In the description below, the portion 152M is appropriately referred to as a magnet 152M and the portion 152S is appropriately referred to as a spacer member 152S.

In the present embodiment, the magnet 152M and the spacer member 152S are fixed to each other with a fixing member 21 like a bolt. The magnet 152M is connected to the second base 2 (support member 19) through the spacer member 152S. With the spacer member 152S, the position (height) of the magnet 152M relative to a Z axis direction is adjusted. With the spacer member 152S, a dimension of a gap between an upper surface 151a of the first member 151 and the lower surface 152Mb of the magnet 152M that faces the upper surface 151a of the first member 151 is adjusted.

The spacer member 152S includes a lower surface 152Sb and an upper surface 152Sa that can face the second base 2 (support member 19). In the present embodiment, the spacer member 152S includes a hole 152H that connects the lower surface 152Sb and the upper surface 152Sa. The hole 15211 is a through hole connecting the upper surface 152Sa and the lower surface 152Sb. A fixing member 22 for fixing the second member 152 (spacer member 152S) and the second base 2 (support member 19) is arranged in the hole 152H. The fixing member 22 includes a bolt, for example. At least a part of the fixing member 22 can be arranged in the hole 152H. Further, a hole 2H in which a tip portion of the fixing member (bolt) 22 can be arranged is formed in at least a part of the second base 2 (support member 19). A screw groove is formed in an inner surface of the hole 2H. The screw groove may also be formed in an inner surface of the hole 152H.

The lower surface 152Sb is larger than the lower surface 152Mb and extends to an outer side than the lower surface 152Mb on an XY plane. At least a part of the lower surface 152Sb extends to an outer side than the lower surface 152Mb with respect to the center of the space between the first base 1 and the second base 2. Further, the lower surface 152Sb extends to an outer side than a side surface 152Ms of the magnet 152M. At least a part of the lower surface 152Sb extends to an outer side than the side surface 152Ms with respect to the center of the space between the first base 1 and the second base 2. A space MS is formed below the lower surface 152Sb. The space MS is arranged at an outer side than the magnet 152M with respect to the center of the space between the first base 1 and the second base 2.

In the present embodiment, when the second member 152 is fixed to the second base 2 (support member 19), the fixing member 22 is inserted into the hole 152H from a side of the lower surface 152Sb of the spacer member 152S in a state where the upper surface 152Sa of the second member 152 (spacer member 152S) and the lower surface of the second base 2 (support member 19) face each other. That is, the fixing member 22 is arranged in the space MS and the fixing member 22 arranged in the space MS is inserted from the lower surface 152Sb side into the hole 152H in the state where the upper surface 152Sa of the second member 152 (spacer member 152S) and the lower surface of the second base 2 (support member 19) are in contact with each other. A part of the fixing member (bolt) 22 inserted in the hole 152H is screwed into the screw groove of the hole 2H, so that the second member 152 and the second base 2 (support member 19) are fixed to each other.

When the second member 152 is released from the second base 2 (support member 19), the fixing member 22 is rotated such that the connection between the fixing member 22 and the screw groove of the hole 2H is released. At least a part of the fixing member 22, the connection of which with the screw groove of the hole 2H has been released, is moved to a more −Z side than the lower surface 152Sb, and is arranged in the space MS.

As described above, in the present embodiment, the fixing member 22 can be inserted into the hole 152H and the hole 2H from a lower side of the hole 152H. The fixing member 22 arranged in the hole 152H can be taken out from the lower side of the hole 152H. Accordingly, adjustment work of the suction force generation device 15 is smoothly performed in a state where the table 3 is arranged on the second base 2, for example. Adjustment (change) of the suction force of the suction force generation device 15 includes, for example, at least one of adjustment of a dimension of a gap between the first member 151 and the second member 152 (magnet 152M), replacement of the second member 152, and adjustment of the number of second members 152 (magnets 152M) arranged in positions facing the first member 151.

The dimension of the gap between the first member 151 and the magnet 152M is adjusted with the spacer member 152S. For the adjustment of the suction force of the suction force generation device 15, there is a possibility 5 that the dimension of the gap between the first member 151 and the magnet 152M is required to be adjusted by, for example, the replacement of the spacer member 152S or the increase/decrease in the number of the spacer members 152S after the second member 152 fixed to the second base 2 is removed from the second base 2. Further, for the adjustment of the suction force of the suction force generation device 15, there is a possibility that the magnet 152M fixed to the second base 2 is required to be replaced with a magnet 152M having strong suction force (magnetic force), or with a magnet 152M having weak suction force (magnetic force). Further, for the adjustment of the suction force of the suction force generation device 15, there is a possibility that the number of the second members 152 (magnets 152M) is required to be adjusted by removal/addition of a part of the second members 152 of the plurality of second members 152 fixed to the second base 2 from/to the second base 2.

According to the present embodiment, the second member 152 includes the portion 152M and the portion 152S, and the hole 152H for allowing the fixing member 22 to be arranged therein is provided in the portion 152S. Therefore, the adjustment work of the suction force generation device 15 is smoothly performed. For example, the above-described adjustment work can be smoothly performed without removing the second base 2 from a table device AT. That is, the above-described adjustment work can be smoothly performed in a state where the second base 2 is arranged on the first base 1.

For example, to enhance bearing rigidity of a gas bearing 9Z, making the dimension of the gap between the lower surface 90 and the reference surface 1G (that is, an amount of floating) small by enhancement of a supply amount of the gas through the supply port 91 (supply air pressure) and an increase in the suction force by the suction force generation device 15 can be considered. Further, in a case of decreasing the bearing rigidity of the gas bearing 9Z, there is a possibility that adjustment of the suction force of the suction force generation device 15 is required. In the present embodiment, the adjustment work of the suction force of the suction force generation device 15 can be smoothly performed, and the adjustment of the bearing rigidity of the gas bearing 9Z can be smoothly performed.

By the smooth adjustment work, the second base 2 can be moved in the target trajectory, and for example, inclination of the second base 2 (reference surface 2G) with respect to the XY plane is suppressed. Therefore, a decrease in positioning accuracy of a table 3 supported by the second base 2 is suppressed.

The same applies to adjustment work of the suction force generation device 14 and adjustment work of bearing rigidity of a gas bearing 7Z. A second member 142 of the suction force generation device 14 includes a first portion facing a first member 141, and a second portion arranged above the first portion and having at least a part thereof that extends to an outer side than the first portion with respect to the center of the space between the first base 1 and the second base 2. A hole that allows a fixing member like a bolt to be arranged therein is formed in the second portion.

Further, in a case of performing adjustment work of the suction force generation device 16, the adjustment work can be smoothly performed without removing the table device AT from the table 3, or without removing an object S placed on the table 3 from the table 3. That is, a second member 162 of the suction force generation device 16 includes a first portion facing a first member 161, and a second portion arranged above the first portion and having at least a part thereof that extends to an outer side than the first portion with respect to the center of the space between the second base 2 and the table 3. A hole that allows a fixing member like a bolt to be arranged therein is formed in the second portion. Therefore, the adjustment work can be smoothly performed in a state where the table 3 is arranged on the second base 2, or a state where the object S is supported on the table 3. Since the adjustment work of the suction force generation device 16 can be smoothly performed, adjustment work of bearing rigidity of a gas bearing 11Z can be smoothly performed.

By the smooth adjustment work, the table 3 can be moved in the target trajectory, and inclination of the table 3 (upper surface 3S) with respect to the XY plane is suppressed. Therefore, the decrease in the positioning accuracy of the table 3 is suppressed.

The same applies to adjustment work of the suction force generation device 17 and adjustment work of bearing rigidity of a gas bearing 13Z. A second member 172 of the suction force generation device 17 includes a first portion facing a first member 171, and a second portion arranged above the first portion, and having at least a part thereof that extends to an outer side than the first portion with respect to the center of the space between the second base 2 and the table 3. A hole that allows a fixing member like a bolt is arranged therein is formed in the second portion.

In the present embodiment, the portion 152M includes the magnet (permanent magnet) and the portion 152S includes the spacer member. The portion 152M and the portion 152S may be integrated. In the present embodiment, the second member 152 (portion 152M) of the suction force generation device 15 includes the permanent magnet. However, the second member 152 (portion 152M) may include an electromagnet. In the present embodiment, the suction force generation device 15 generates the suction force (force to pull the second base 2 to the first base 1) based on the magnetic force. However, the suction force generation device 15 may generate suction force based on, for example, vacuum force. For example, a suction port through which a gas can be suctioned may be provided in the second member 152, and the gas may be suctioned through the suction port provided in the second member 152 in a state where the first member 151 and the second member 152 face each other through a gap.

<Third Embodiment>

Figure 7:
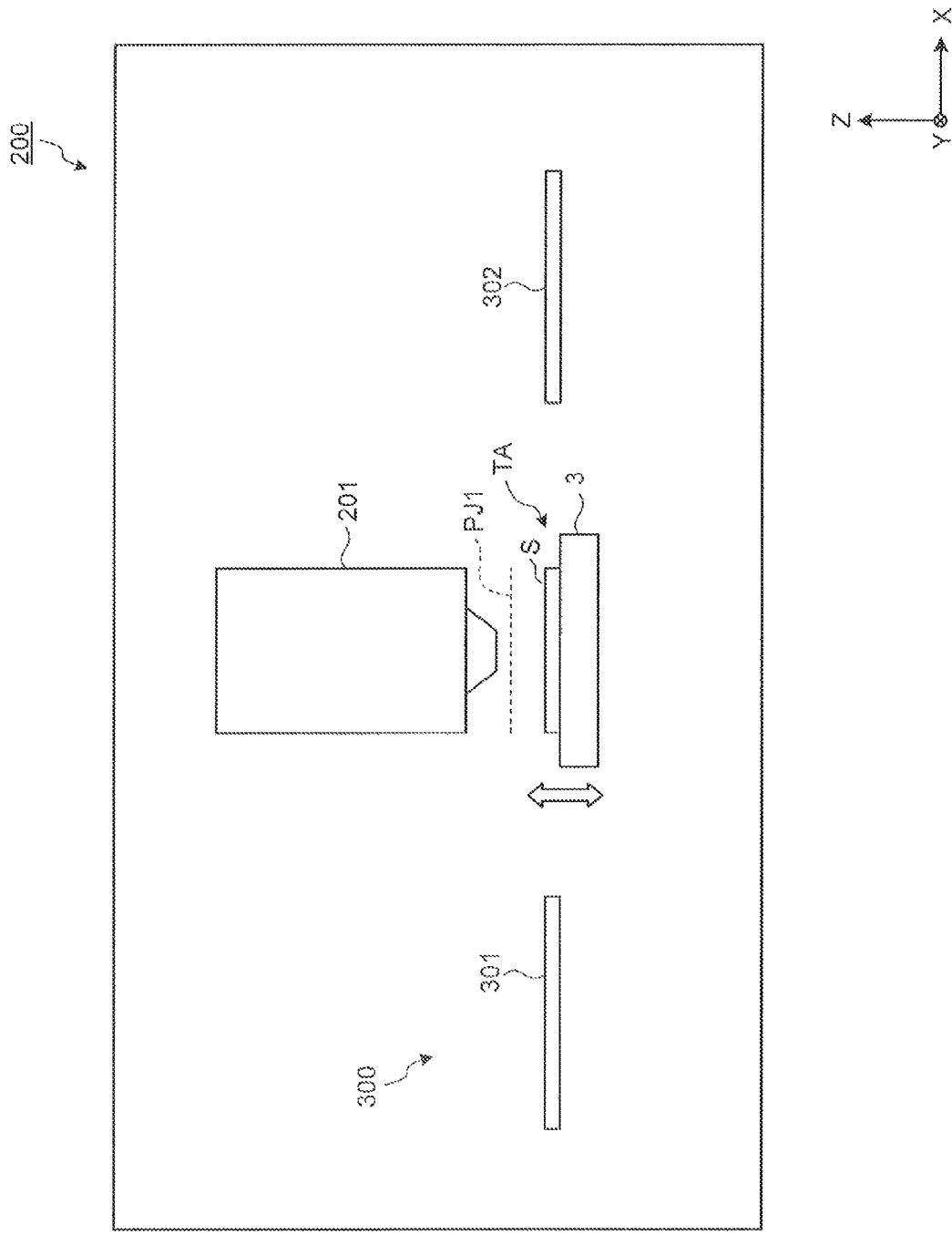
FIG. 7 is a diagram illustrating an example of a conveyance device and a semiconductor manufacturing device according to the present embodiment.

A third embodiment will be described. FIG. 7 is a diagram illustrating an example of a semiconductor manufacturing device 200 provided with a table device TA according to the present embodiment. The semiconductor manufacturing device 200 includes a semiconductor device manufacturing device that can manufacture a semiconductor device. The semiconductor manufacturing device 200 is used in at least a part of a process of manufacturing a semiconductor device. The semiconductor manufacturing device 200 includes a conveyance device 300 that can convey an object S for manufacturing the semiconductor device. The conveyance device 300 includes the table device TA according to the present embodiment. Note that the table device TA is simplified and illustrated in FIG. 7.

In the present embodiment, the object S is a substrate for manufacturing the semiconductor device. The semiconductor device is manufactured from the object S. The object S may include a semiconductor wafer or a glass plate. The semiconductor device is manufactured by formation of a device pattern (wiring pattern) on the object S.

The semiconductor manufacturing device 200 performs processing for forming the device pattern, for the object S arranged in a processing position PJ1. The table device TA arranges the object S supported by the table 3 in the processing position PJ1. The conveyance device 300 includes a carry-in device 301 that can convey (carry in) the object S to the table 3 of the table device TA, and a carry-out device 302 that can convey (carry out) the object S from the table 3. The object S before processing is conveyed (carried in) to the table 3 by the carry-in device 301. The object S supported by the table 3 is conveyed to the processing position PJ1 by the table device TA. The object S after processing is conveyed (carried out) from the table 3 by the carry-out device 302.

The table device TA moves the table 3 to move the object S supported by the table 3 to the processing position PJ1. The table device TA can move the table 3 in a target trajectory, and can arrange the object S supported by the table 3 to the processing position (target position) PJ1.

For example, when the semiconductor manufacturing device 200 includes an exposure device that projects an image of the device pattern to the object S through a projection optical system 201, the processing position PJ1 includes a position (exposure position) of an image plane of the projection optical system 201. By arrangement of the object S in the processing position PJ1, the semiconductor manufacturing device 200 can project the image of the device pattern to the object S through the projection optical system 201.

After the object S is processed in the processing position PJ1, the object S after processing is conveyed from the table 3 by the carry-out device 302. The object S conveyed (carried out) by the carry-out device 302 is conveyed to a processing device that performs a post-process.

In the present embodiment, the table device TA can arrange the object S in the processing position (target position) PJ1. Therefore, manufacturing of a defective product is suppressed. That is, a decrease in positioning accuracy of the object S in the semiconductor manufacturing device 200 is suppressed by the table device TA. Therefore, generation of the defective product is suppressed.

When the semiconductor manufacturing device 200 includes a measuring device that measures the device pattern of the object S through an optical system, the processing position PJ1 includes a position (measuring position) of a focal point of the optical system. By arrangement of the object S in the processing position PJ1, the semiconductor manufacturing device 200 can acquire an image of the device pattern formed on the object S through the optical system. When the semiconductor manufacturing device 200 includes a film forming device that forms a film on the object S, the processing position PJ1 is a position where a material for forming the film can be supplied. By arrangement of the object S in the processing position PJ1, the film for forming the device pattern is formed on the object S.

Note that a flat panel display manufacturing device may include the table device TA according to the present embodiment, or may include the conveyance device 300 including the table device TA. The flat panel display manufacturing device includes the exposure device, for example, and is used in at least a part of a process of manufacturing a flat panel display. When the flat panel display manufacturing device includes the exposure device, an image of a pattern for manufacturing the flat panel display is projected to the object S that includes a glass plate through the projection optical system. The flat panel display manufacturing device can process the object S arranged in a target position. Therefore, manufacturing of a defective product from the object S is suppressed. The flat panel display includes at least one of a liquid crystal display, a plasma display, and an organic EL display.

Figure 8:
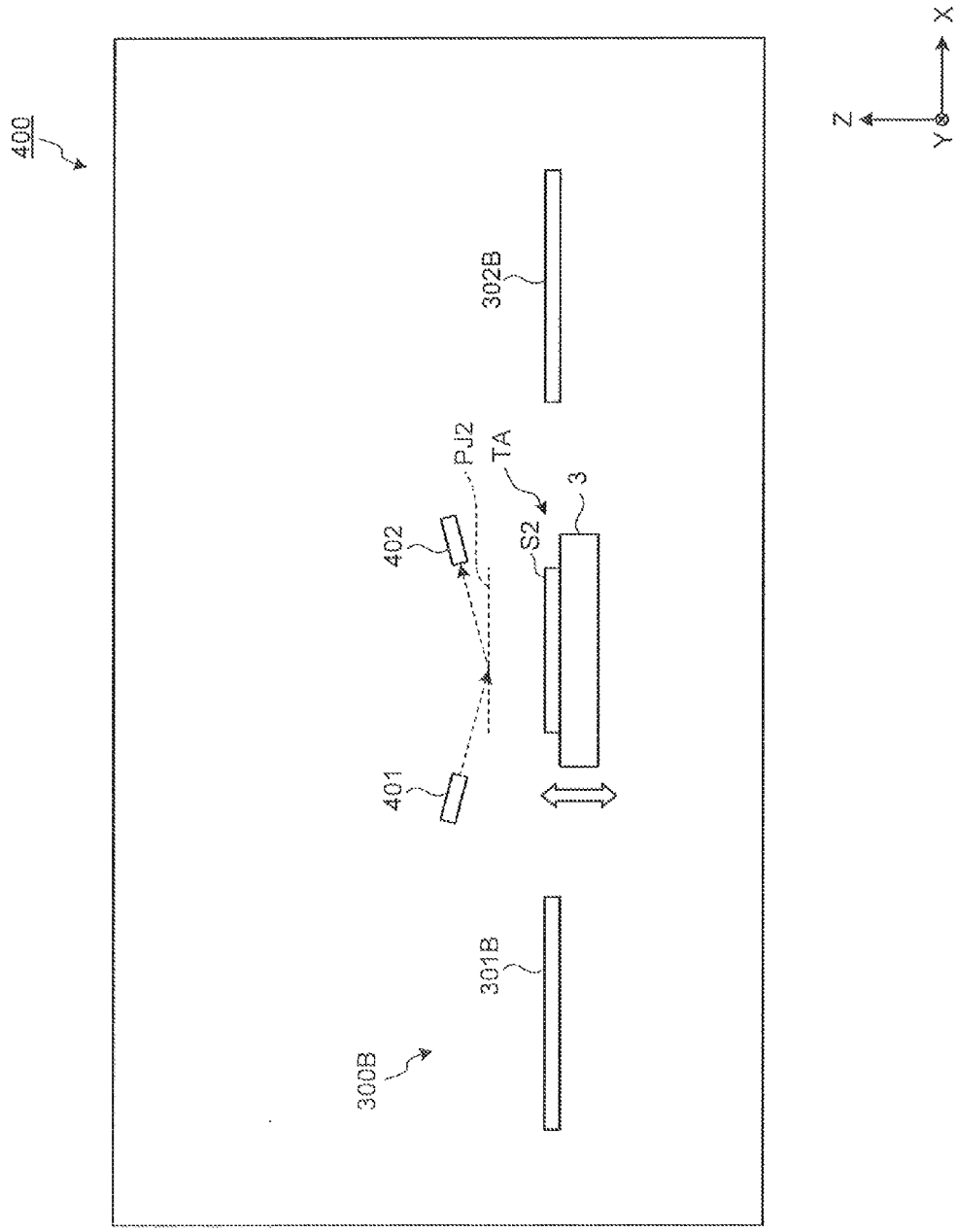
FIG. 8 is a diagram illustrating an example of the conveyance device and an inspection device according to the present embodiment.

FIG. 8 is a diagram illustrating an example of an inspection device 400 provided with the table device TA according to the present embodiment. The inspection device 400 inspects an object (semiconductor device) S2 manufactured by the semiconductor manufacturing device 200. The inspection device 400 includes a conveyance device 300B that can convey the object S2. The conveyance device 300B includes the table device TA according to the present embodiment. In FIG. 8, the table device TA is simplified and illustrated.

The inspection device 400 inspects the object S2 arranged in an inspection position PJ2. The table device TA arranges the object S2 supported by the table 3 in the inspection position PJ2. The conveyance device 300B includes a carry-in device 301B that can convey (carry in) the object S2 to the table 3 of the table device TA, and a carry-out device 302B that can convey (carry out) the object S2 from the table 3. The object S2 before inspection is conveyed (carried in) to the table 3 by the carry-in device 301B. The object S2 supported by the table 3 is conveyed to the inspection position PJ2 by the table device TA. The object S2 after inspection is conveyed (carried out) from the table 3 by the carry-out device 302B.

The table device TA moves the table 3 to move the object S2 supported by the table 3 to the inspection position PJ2. The table device TA can move the table 3 in the target trajectory, and can arrange the object S2 supported by the table 3 to the inspection position (target position) PJ2.

In the present embodiment, the inspection device 400 optically inspects the object S2, using inspection light. The inspection device 400 includes an irradiation device 401 that can emit the inspection light, and a light-receiving device 402 that can receive at least a part of the inspection light emitted from the irradiation device 401 and reflected at the object S2. In the present embodiment, the inspection position PJ2 includes an irradiation position of the inspection light. By arrangement of the object S2 in the inspection position PJ2, the state of the object S2 is optically inspected.

After the inspection of the object S2 is performed in the inspection position PJ2, the object S2 after inspection is conveyed from the table 3 by the carry-out device 302B.

In the present embodiment, the table device TA can arrange the object S2 in the inspection position (target position) PJ2, and thus can suppress generation of inspection failure. That is, the inspection device 400 can favorably determine whether the object S2 is defective. Accordingly, for example, conveyance of the defective object S2 to the post-process, or shipment of the detective object S2 is suppressed.

Note that, in the present embodiment, the table 3 has been moved in the XY plane (horizontal plane). In the present embodiment, the table 3 may be moved in a direction inclined with respect to the XY plane. The second base 2 may be moved in a direction inclined with respect to the XY plane. In other words, one or both of the second base 2 and the table 3 may be moved in a predetermined surface inclined with respect to the horizontal plane.

The invention claimed is:

1. A table device comprising:
a first base including a first reference surface parallel to a predetermined surface;
a second base including a second reference surface parallel to the predetermined surface, and movable on the first reference surface in a first direction parallel to a first axis existing in the predetermined surface;
a first bearing member that is provided to the second base, includes a first gas supply port facing the first reference surface, and forms a gas bearing between the first bearing member and the first reference surface with a gas supplied through the first gas supply port;
a second bearing member that is provided to the second base, apart from the first bearing member relative to a second direction parallel to a second axis perpendicular to the first axis and existing in the predetermined surface, includes a second gas supply port facing the first reference surface, and forms a gas bearing between the second bearing member and the first reference surface with a gas supplied through the second gas supply port;
a table movable on the second reference surface in the second direction parallel to the second axis;
a second guide member that is provided to the second base, and guides the table to the second direction parallel to the second axis;
a third bearing member that is provided to the table, includes a third gas supply port facing the second reference surface, and a fourth gas supply port facing a first side surface of the second guide member, the first side surface facing a first direction parallel to the first axis, forms a gas bearing between the third bearing member and the second reference surface with a gas supplied through the third gas supply port, and forms a gas bearing between the third bearing member and the first side surface with a gas supplied through the fourth gas supply port; and
a fourth bearing member that is provided to the table, includes a fifth gas supply port facing a second side surface of the second guide member, the second side surface facing an opposite direction to the first direction, and forms a gas bearing between the fourth bearing member and the first side surface with a gas supplied through the fifth supply port,
wherein a distance between the first bearing member and the second bearing member is longer than a dimension of a moving range of the table relative to the second direction parallel to the second axis.

2. The table device according to claim 1, wherein the moving range of the table is determined such that a center of gravity of the table is moved between the first bearing member and the second bearing member relative to the second direction parallel to the second axis.

3. The table device according to claim 1, comprising a first guide member that is provided to the first base, and guides the second base to the first direction parallel to the first axis.

4. The table device according to claim 3, comprising a fifth bearing member that is provided to the second base, includes a sixth gas supply port facing a third side surface of the first guide member, the third side surface facing the second direction parallel to the second axis, and forms a gas bearing between the fifth bearing member and the third side surface with a gas supplied through the sixth gas supply port, wherein
the first bearing member includes a seventh gas supply port arranged to face a fourth side surface of the first guide member, the fourth side surface facing an opposite direction to the second direction, and forms a gas bearing between the first bearing member and the fourth side surface with a gas supplied through the seventh gas supply port.

5. The table device according to claim 1, comprising a sixth bearing member that is provided to the table, apart from the third bearing member relative to the first direction parallel to the first axis, includes an eighth gas supply port facing the second reference surface, and forms a gas bearing between the sixth bearing member and the second reference surface with a gas supplied through the eighth gas supply port.

6. The table device according to claim 1, comprising a suction force generation device that is arranged between the first base and the second base, and generates force to pull the second base to the first base.

7. A conveyance device comprising the table device according to claim 1.

8. A table device comprising:
a first base including a first reference surface parallel to a predetermined surface;
a second base including a second reference surface parallel to the predetermined surface, and movable on the first reference surface in a first direction parallel to a first axis existing in the predetermined surface:
a first bearing member that is provided to the second base, includes a first as supply port facing the first reference surface, and forms a gas bearing between the first bearing member and the first reference surface with a gas supplied through the first gas supply port;
a second bearing member that is provided to the second base, apart from the first bearing member relative to a second direction parallel to a second axis perpendicular to the first axis and existing in the predetermined surface, includes a second gas supply port facing the first reference surface, and forms a gas bearing between the second bearing member and the first reference surface with a gas supplied through the second gas supply port:
a table movable on the second reference surface in the second direction parallel to the second axis; and
a suction force generation device that is arranged between the first base and the second base, and generates force to pull the second base to the first base,
wherein
the suction force generation device includes a first member connected to the first base, and a second member connected to the second base and capable of generating the force to pull the second base between the second member and the first member,
the second member includes a first portion including a first lower surface facing the first member, and a second portion arranged above the first portion, and including a second lower surface, at least a part of the second lower surface extending to an outer side than the first portion, the second portion includes a hole connecting the second lower surface and an upper surface of the second member, and a fixing member for fixing the second member and the second base is arranged in the hole.

9. A table device comprising:

a base including a reference surface parallel to a predetermined surface;

a movable member movable on the reference surface;

a bearing member that is provided to the movable member, includes a gas supply port facing the reference surface, and forms a gas bearing between the bearing member and the reference surface with a gas supplied through the gas supply port; and a suction force generation device that includes a first member connected to the base and a second member connected to the movable member, and generates force to pull the movable member to the base between the first member and the second member, wherein the second member includes a first portion including a first lower surface facing the first member, and a second portion arranged above the first portion, and including a second lower surface, at least a part of the second lower surface extending to an outer side than the first portion, the second portion includes a hole connecting the second lower surface and an upper surface of the second member, and a fixing member for fixing the second member and the movable member is arranged in the hole.

\* \* \* \* \*